(12) United States Patent
Wu et al.

(10) Patent No.: US 8,264,383 B2
(45) Date of Patent: Sep. 11, 2012

(54) GROUP KEYPADS IN COMPLIANCE WITH STANDARD KEYBOARD INSTALLATION

(75) Inventors: Fong-Gong Wu, Tainan (TW); Han-Chi Hsiao, Tainan (TW); Yun-Yu Wu, Tainan (TW); Chia-Wei Chang, Tainan (TW)

(73) Assignee: National Cheng Kung University, Tainan (TW)

( * ) Notice: Subject to any disclaimer, the term of this patent is extended or adjusted under 35 U.S.C. 154(b) by 368 days.

(21) Appl. No.: 12/771,259

(22) Filed: Apr. 30, 2010

(65) Prior Publication Data

US 2010/0277350 A1     Nov. 4, 2010

(30) Foreign Application Priority Data

Apr. 30, 2009 (TW) ............................... 98207353 U
Apr. 30, 2009 (TW) ............................... 98207354 U

(51) Int. Cl.
*H03M 11/00* (2006.01)

(52) U.S. Cl. ............ 341/22; 341/26; 345/168; 345/169; 400/480; 400/484; 400/494; 400/495

(58) Field of Classification Search ............. 341/22, 341/26; 345/168, 169; 400/495, 480, 484, 400/494

See application file for complete search history.

(56) References Cited

U.S. PATENT DOCUMENTS

| | | | |
|---|---|---|---|
| 5,841,374 A * | 11/1998 | Abraham | 341/34 |
| 6,528,741 B2 * | 3/2003 | Walker | 200/5 R |
| 6,542,091 B1 * | 4/2003 | Rasanen | 341/22 |
| 7,339,498 B2 * | 3/2008 | Ahn | 341/22 |
| 7,504,967 B2 * | 3/2009 | Griffin | 341/22 |
| 7,953,448 B2 * | 5/2011 | Pletikosa et al. | 455/564 |
| 8,164,570 B2 * | 4/2012 | Dietz et al. | 345/168 |
| 2006/0267804 A1 * | 11/2006 | Pham | 341/22 |
| 2008/0088491 A1 * | 4/2008 | Ahn | 341/22 |
| 2008/0252603 A1 * | 10/2008 | Dietz et al. | 345/169 |
| 2009/0128369 A1 * | 5/2009 | Rak et al. | 341/22 |
| 2010/0201547 A1 * | 8/2010 | Kim | 341/22 |
| 2011/0063787 A1 * | 3/2011 | Griffin | 361/679.08 |

\* cited by examiner

*Primary Examiner* — Linh Nguyen

(74) *Attorney, Agent, or Firm* — Muncy, Geissler, Olds & Lowe, PLLC

(57) ABSTRACT

A group keypad structure in compliance with a standard keyboard installation includes group keypads corresponding to characters of a standard keyboard input method; for example, the structure includes ten group keypads installed from left to right on a base, and the ten group keypads include characters of "Q, A, Z", "W, S, X", "E, D, C", "R, F, V", "T, G, B", "Y, H, N", "U, J, M", "I, K, ,", "O, L, ." and "P, ;, /" respectively, and further includes ten numeric characters "1~0", so as to achieve the effects of reducing the area of a keyboard, shortening the moving distance of a user's fingers, providing an easy and convenient carry, complying with the user's using habit, and improving the input speed.

25 Claims, 21 Drawing Sheets

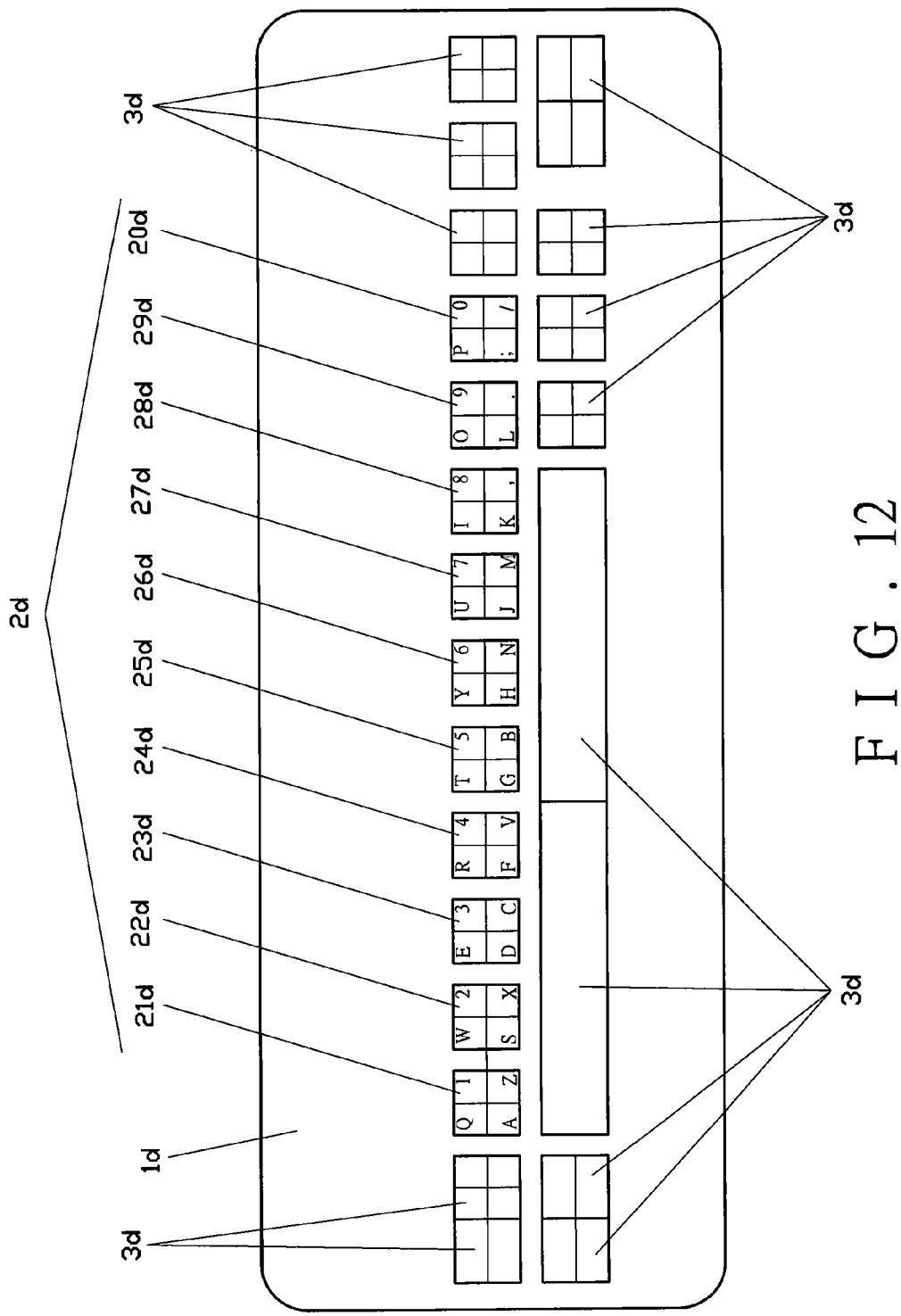
F I G. 12

GROUP KEYPADS IN COMPLIANCE WITH STANDARD KEYBOARD INSTALLATION

FIELD OF THE INVENTION

The present invention relates to group keypads in compliance with a standard keyboard installation, and more particularly to a group keypad structure having keys corresponding to characters of a standard keyboard input method and installed onto a base for reducing the area of a keyboard to enhance portability and complying with a user's input habit to improve the input speed.

BACKGROUND OF THE INVENTION

At present, a general standard keyboard includes a plurality of rows of keys installed on a base, and each key represents a numeric character or a textual character. For example, the base used for an English input method is composed of four independent character keys "1, Q, A, Z" sequentially arranged from the left to the right of the first row, four independent character keys "2, W, S, X" sequentially arranged from the left to the right of the second row, and so on for the remaining rows (and the layout of a standard keyboard is a universal mode, and thus will not be described herein). However, each character of the installation mode of such keyboard occupies an independent key, and a gap between the independent keys is required for the partition purpose, so that the area of the standard keyboard cannot be reduced, and its weight must be increased. As a result, it is relatively difficult for users to carry the standard keyboard, particularly to those applied as a standard keyboard of a mobile phone. Although some mobile phones (such as blackberry) adopt the standard keyboard mode, yet the area of the keyboard is too large for an easy carry.

To overcome the aforementioned drawback, a "one-row keyboard and approximate typing" disclosed in U.S. Pat. No. 7,387,457 adopts the standard keyboard mode and includes a plurality of textual or numeric characters arranged in rows and installed to keys at different electric contact positions respectively, so that when a user presses a letter at a different key, a software is provided for combining the input into a corresponding character, but sometimes errors of the combination occur, and thus causing troubles to users, requiring the users to enter the letter again, and affecting the input speed. The aforementioned keyboard not wastes time only, but also causes operational troubles. Obviously it is not good for its intended application.

R.O.C. Pat. Publication No. 200723686 entitled "Composite-key keyboard, electronic device and character input method" discloses a keyboard having a plurality of composite keys installed on the keyboard, and the composite keys include a primary key and a subordinate key, and each primary or subordinate key represents a character, and the primary and subordinate keys are installed adjacent to each other and can be pressed individually or simultaneously provided for inputting a corresponding character. However, this structure sometimes requires users to press the primary and subordinate keys together, thereby wasting time, causing operational troubles, failing to comply with the standard keyboard installation and affecting the input speed. Obviously, it is not good for its intended application.

SUMMARY OF THE INVENTION

In view of the drawbacks of the conventional standard keyboards including the too-large area of the keyboard, the difficulty to carry the keyboard, the failure for some keyboards of mobile phones to comply with the layout of characters of a standard keyboard input method, and the result of a too-slow input speed, the present invention provides a group keypad structure in compliance with a standard keyboard installation, and the structure comprises ten group keypads installed on a base, and the base includes a left side and a right side opposite to the left side, and the ten group keypads are arranged from the left side to the right side of the base, and the ten group keypads are a first group keypad, a second group keypad, a third group keypad, a fourth group keypad, a fifth group keypad, a sixth group keypad, a seventh group keypad, an eighth group keypad, a ninth group keypad and a tenth group keypad arranged sequentially from the left side to the right side of the base, and each group keypad is at least divided into a first region, a second region and a third region, and each group keypad includes the following characters sequentially arranged in the first region, the second region and the third region, wherein the first group keypad includes characters "Q, A, Z";
the second group keypad includes characters "W, S, X";
the third group keypad includes characters "E, D, C";
the fourth group keypad includes characters "R, F, V";
the fifth group keypad includes characters "T, G, B";
the sixth group keypad includes characters "Y, H, N";
the seventh group keypad includes characters "U, J, M";
the eighth group keypad includes characters "I, K, ,";
the ninth group keypad includes characters "O, L, ."; and
the tenth group keypad includes characters "P, ;, /".

The base includes an upper side and a lower side opposite to the upper side, and each group keypad is in a rectangular shape, and each group keypad is divided into a first region, a second region and a third region arranged from the upper side to the lower side of the base, and each corresponding group keypad includes a numeric key labeled with a numeric character, and a first numeric key, a second numeric key, a third numeric key, a fourth numeric key, a fifth numeric key, a sixth numeric key, a seventh numeric key, an eighth numeric key, a ninth numeric key, and a tenth numeric key are sequentially arranged from the left side to the right side of the base, wherein the first numeric key includes a character "1";
the second numeric key includes a character "2";
the third numeric key includes a character "3";
the fourth numeric key includes a character "4";
the fifth numeric key includes a character "5";
the sixth numeric key includes a character "6";
the seventh numeric key includes a character "7";
the eighth numeric key includes a character "8";
the ninth numeric key includes a character "9", and
the tenth numeric key includes a character "0".

Each of the aforementioned group keypads can be in a triangular shape, and each group keypad is divided into a first region, a second region and a third region formed from the central area of the group keypad, and each region of each group keypad occupies a corner of the triangular shape, and a character is labeled at a corner of each region, and each corresponding group keypad includes a numeric key labeled with a numeric character, and a first numeric key, a second numeric key, a third numeric key, a fourth numeric key, a fifth numeric key, a sixth numeric key, a seventh numeric key, an eighth numeric key, a ninth numeric key, and a tenth numeric key are sequentially arranged from the left side to the right side of the base, wherein the first numeric key includes a character "1";
the second numeric key includes a character "2";
the third numeric key includes a character "3";

the fourth numeric key includes a character "4";
the fifth numeric key includes a character "5";
the sixth numeric key includes a character "6";
the seventh numeric key includes a character "7";
the eighth numeric key includes a character "8";
the ninth numeric key includes a character "9", and
the tenth numeric key includes a character "0".

Each of the aforementioned group keypad can be in a square shape, and each group keypad is divided into a first region, a second region and a third region by intersected diagonals of the square shaped group keypad, and each characters is labeled at a side of each region, and each group keypad further includes a fourth region, and the following respective characters are sequentially arranged in the fourth region of each group keypad, wherein
the first group keypad includes a character "1";
the second group keypad includes a character "2";
the third group keypad includes a character "3";
the fourth group keypad includes a character "4";
the fifth group keypad includes a character "5";
the sixth group keypad includes a character "6";
the seventh group keypad includes a character "7";
the eighth group keypad includes a character "8";
the ninth group keypad includes a character "9"; and
the tenth group keypad includes a character "0".

Each of the aforementioned group keypad can be in a quadrilateral shape, and each group keypad is divided into a first region, a second region and a third region by the interested mid-lines of the quadrilateral group keypad, and each character of each group keypad is labeled at a side of each region, and each group keypad further includes a fourth region, and the following respective characters are sequentially labeled in the fourth region of each group keypad, wherein:
the first group keypad includes a character "1",
the second group keypad includes a character "2",
the third group keypad includes a character "3",
the fourth group keypad includes a character "4",
the fifth group keypad includes a character "5",
the sixth group keypad includes a character "6",
the seventh group keypad includes a character "7",
the eighth group keypad includes a character "8",
the ninth group keypad includes a character "9", and
the tenth group keypad includes a character "0".

Each of the aforementioned group keypad is in a square shape, and each group keypad is divided into a first corner, a second corner and a third corner by lines connecting mid-points of adjacent sides of the square shaped group keypad, and each character of each group keypad is labeled at a corner of each region, and each group keypad further includes a fourth corner, and the following characters are sequentially arranged in the fourth region of each group keypad, wherein:
the first group keypad includes a character "1";
the second group keypad includes a character "2";
the third group keypad includes a character "3";
the fourth group keypad includes a character "4";
the fifth group keypad includes a character "5";
the sixth group keypad includes a character "6";
the seventh group keypad includes a character "7";
the eighth group keypad includes a character "8";
the ninth group keypad includes a character "9"; and
the tenth group keypad includes a character "0".

The aforementioned characters correspond to respective characters of a keyboard input method.

The group keypad structure in compliance with a standard keyboard installation in accordance with the present invention is installed according to a standard keyboard installation, and the group keypad structure comprises five group keypads installed onto a base, and the base includes a left side and a right side opposite to the left side, wherein each group keypad is in a rectangular shape, and the five group keypads are arranged adjacent to each other and from the left side to the right side of the base, and the five group keypads are a first group keypad, a second group keypad, a third group keypad, a fourth group keypad and a fifth group keypad, and each group keypad is divided into a first region, a second region, a third region and a fourth region, and each group keypad includes the following two groups of corresponding characters sequentially arranged in the first region, the second region, the third region and the fourth region, wherein:
the first group keypad includes characters "Q, A, Z, 1" or "P, ;, /, 0";
the second group keypad includes characters "W, S, X, 2" or "O, L, ., 9";
the third group keypad includes characters "E, D, C, 3" or "I, K, ,, 8";
the fourth group keypad includes characters "R, F, V, 4" or "U, J, M, 7"; and
the fifth group keypad includes characters "T, G, B, 5" or "Y, H, N, 6".

A sixth group keypad is divided into a first region, a second region, a third region and a fourth region, and characters "Chord Function Key, Space, Backspace, Shift" are sequentially arranged, wherein the chord function key is provided for switching the first group keypad to any one of the two groups of characters of the fifth group keypad.

The sixth group keypad is installed on the base.

The sixth group keypad is installed on a pointing input device operated together with the base.

The present invention relates to a group keypad structure in compliance with a standard keyboard installation, and the group keypad structure comprises three group keypads, installed on a base, and the base includes a left side and a right side opposite to the left side, wherein each group keypad is in a rectangular shape, and the three group keypads are a first group keypad, a second group keypad and a third group keypad, and each group keypad is divided into a first region, a second region, a third region and a fourth region, and the following characters are sequentially arranged in the first region, second region, third region and fourth region of each group keypad, wherein:
the first group keypad includes characters "1, 4, 7, *";
the second group keypad includes characters "2, 5, 8, 0"; and
the third group keypad includes characters "3, 6, 9, #".

Each of the aforementioned group keypads can be divided into a first region, a second region, a third region and a fourth region by two intersected diagonals, and each character is labeled at a side of each region.

Each of the aforementioned group keypads can be divided into a first region, a second region, a third region and a fourth region by two intersected mid-lines of opposite sides of each group keypad, and each character of each group keypad is labeled at a side of each region.

Each of the aforementioned group keypad is divided into a first region, a second region, a third region and a fourth region by lines formed by connecting mid-points of adjacent sides of the group keypad, and each character of each group keypad is labeled at a side of each region.

The aforementioned characters correspond to respective characters of a keyboard input method. The present invention has the following advantages:

1. The layout of the keys of the present invention fully complies with the characters of a standard keyboard installation and meets the requirements for the use of different input methods to improve the user's input speed and save the user's input time.

2. The group keypad of the present invention has three to four characters installed on a key to reduce the area of the keyboard, facilitate an easy carry, and shorten the moving distance of a user' fingers.

3. In addition to the computer input function, the present invention can also be used as a keyboard for other electronic products such as a mobile phone and a personal digital assistant (PDA).

The present invention will become more obvious from the following description when taken in connection with the accompanying drawings which show, for purposes of illustration only, a preferred embodiment in accordance with the present invention.

BRIEF DESCRIPTION OF THE DRAWINGS

FIG. 12 is a schematic view of a fourth preferred embodiment applied to a computer keyboard in accordance with the fourth embodiment of the present invention;

DETAILED DESCRIPTION OF THE PREFERRED EMBODIMENT

The technical characteristics of the present invention will become apparent with the detailed description of preferred embodiments and the illustration of related drawings as follows.

Figure 1:
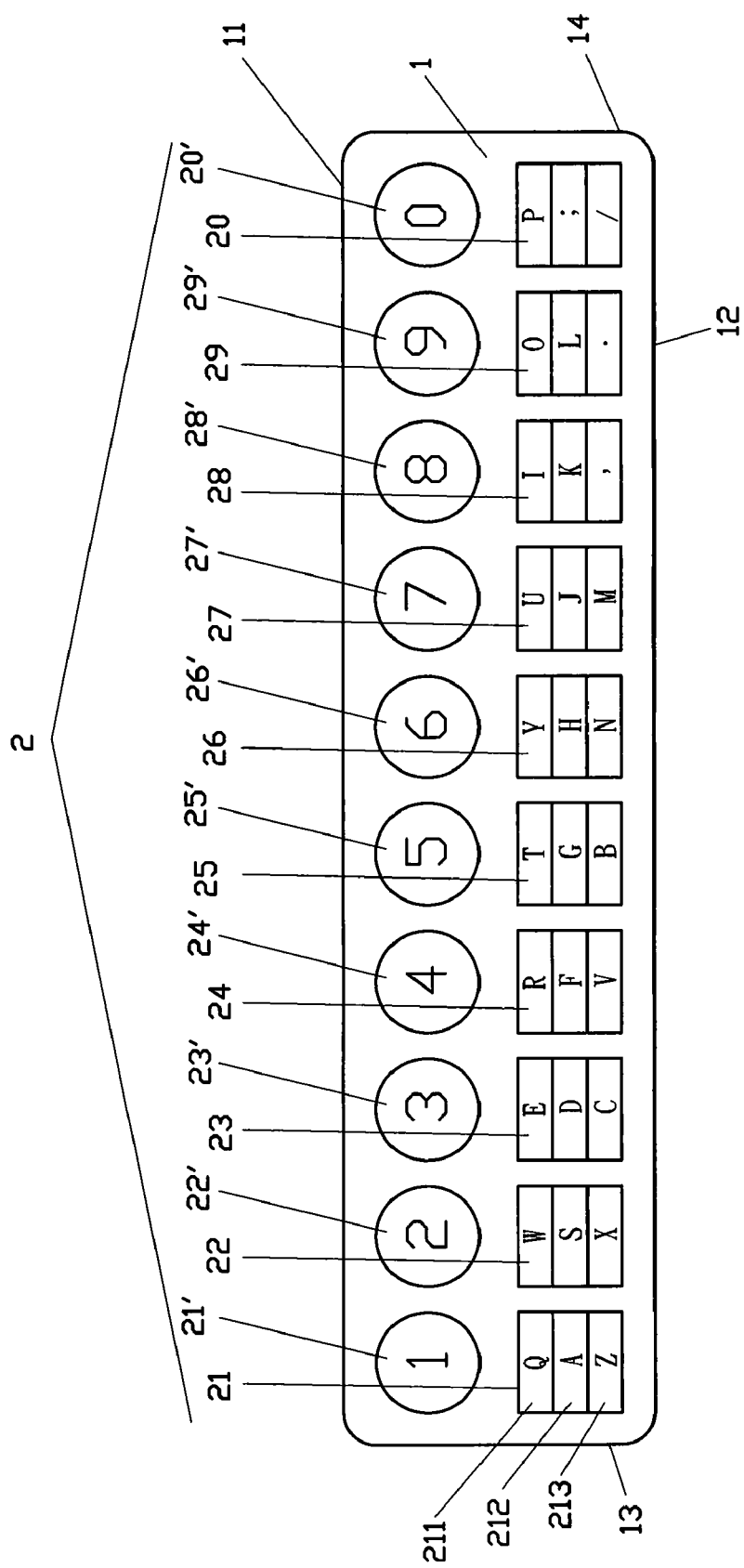
FIG. 1 is a schematic view of a layout of ten group keypads in accordance with a first preferred embodiment of the present invention.
Figure 2:
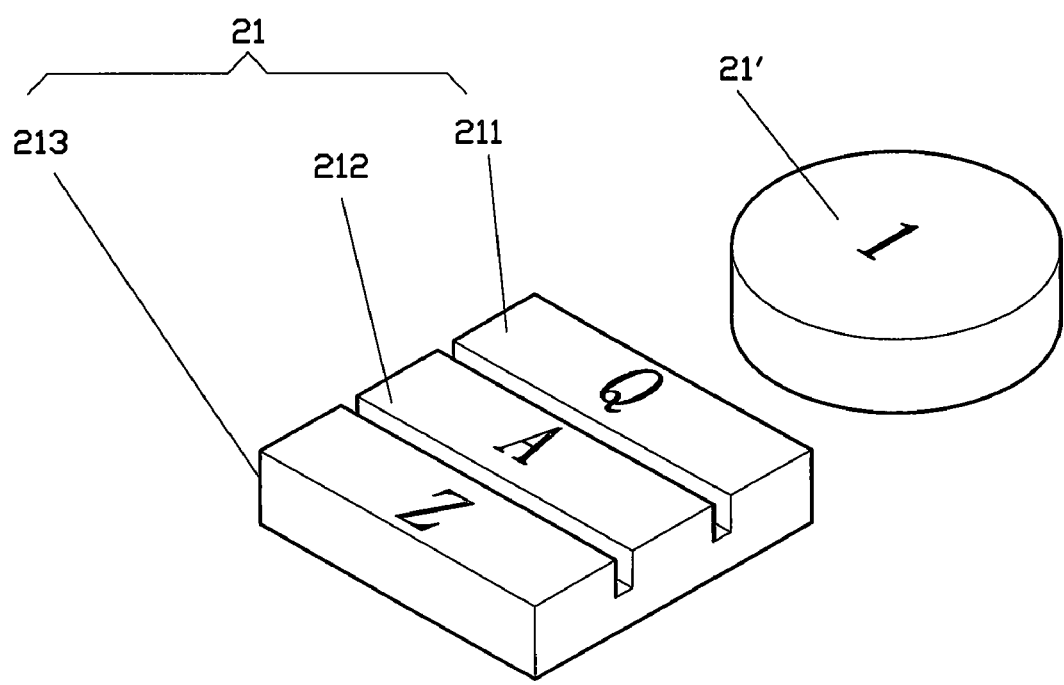
FIG. 2 is a schematic view of a first group keypad in accordance with the first preferred embodiment of the present invention.

With reference to FIGS. 1 and 2 for a group keypad structure in compliance with a standard keyboard installation in accordance with a first preferred embodiment of the present invention, the group keypad structure comprises ten group keypads 2 installed on a base 1, and the base 1 includes an upper side 11, a lower side 12 opposite to the upper side 11, a left side 13, and a right side 14 opposite to the left side 13, and the ten group keypads 2 are sequentially arranged from the left side 13 to the right side 14 of the base 1, and the ten group keypads 2 are a first group keypad 21, a second group keypad 22, a third group keypad 23, a fourth group keypad 24, a fifth group keypad 25, a sixth group keypad 26, a seventh group keypad 27, an eighth group keypad 28, a ninth group keypad 29 and a tenth group keypad 20 sequentially arranged from the left side 13 to the right side 14 of the base 1, and the base 1 further includes numeric keys labeled with numeric characters and corresponding to the ten group keypads 2, wherein a first numeric key 21', a second numeric key 22', a third numeric key 23', a fourth numeric key 24', a fifth numeric key 25', a sixth numeric key 26', a seventh numeric key 27', an eighth numeric key 28', a ninth numeric key 29' and a tenth numeric key 20' are sequentially arranged from the left side 13 to the right side 14 of the base 1.

The key structure and character arrangement of the first preferred embodiment of the present invention are shown in FIG. 2, wherein the ten group keypads 2 are in a rectangular shape, and the first group keypad 21 and the first numeric key 21' are used as an example for illustrating the present invention as follows. The first group keypad 21 is divided into a first region 211, a second region 212 and a third region 213 sequentially arranged from the upper side 11 to the lower side 12 of the base 1, and the first region 211, the second region 212 and the third region 213 of the first group keypad 21 include characters "Q, A, Z".

The second group keypad 22 includes characters "W, S, X";
the third group keypad 23 includes characters "E, D, C";
the fourth group keypad 24 includes characters "R, F, V";
the fifth group keypad 25 includes characters "T, G, B";
the sixth group keypad 26 includes characters "Y, H, N";
the seventh group keypad 27 includes characters "U, J, M";
the eighth group keypad 28 includes characters "I, K, ,";
the ninth group keypad 29 includes characters "O, L, ."; and
the tenth group keypad 20 includes characters "P, ;, I".

The first numeric key 21' is in a circular shape and includes a character "1".

The second numeric key 22' includes a character "2";
the third numeric key 23' includes a character "3";
the fourth numeric key 24' includes a character "4";
the fifth numeric key 25' includes a character "5";
the sixth numeric key 26' includes a character "6";
the seventh numeric key 27' includes a character "7";
the eighth numeric key 28' includes a character "8";
the ninth numeric key 29' includes a character "9"; and
the tenth numeric key 20' includes a character "0".

During an input process, a user can input characters according to the user's input habit. In other words, the user can input a desired numeric or textual character on the ten group keypads 2 based on the layout of characters of the original standard keyboard input method, so that the user can select and press at a position corresponding to a number or a text on the first group keypad 21 to the tenth group keypad 20 easily according to the user's original habit. The invention provides a quick way of inputting numeric and textual characters without any hindrance to improve the input speed and save the time for looking for the desired input character key. In addition, four characters are installed on a rectangular key to save the space of the conventional keys that require a gap between each other, and reduce the area and the weight of the keyboard significantly, so as to facilitate an easy carry. The invention can also be applied to a mobile phone without affecting the input speed.

Figure 3:
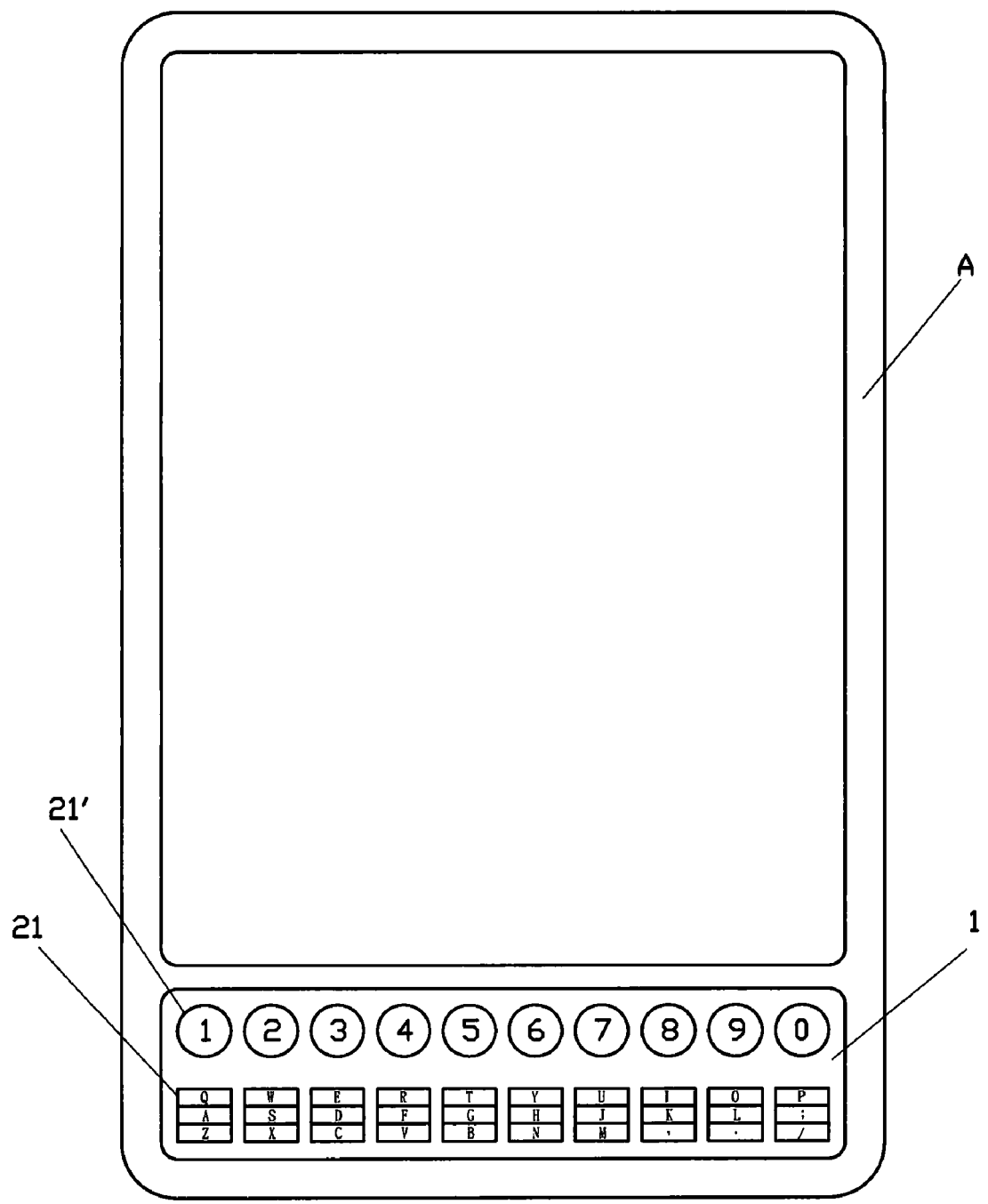
FIG. 3 is a schematic view of a first preferred embodiment applied to a mobile phone in accordance with the first preferred embodiment of the present invention.

The base 1 and the ten group keypads 2 in accordance with the first preferred embodiment of the present invention can be used in a computer keyboard as shown in FIG. 3 as well as a keyboard for any other electronic product such as a personal digital assistant (PDA) or a blackberry, etc.

Figure 4:
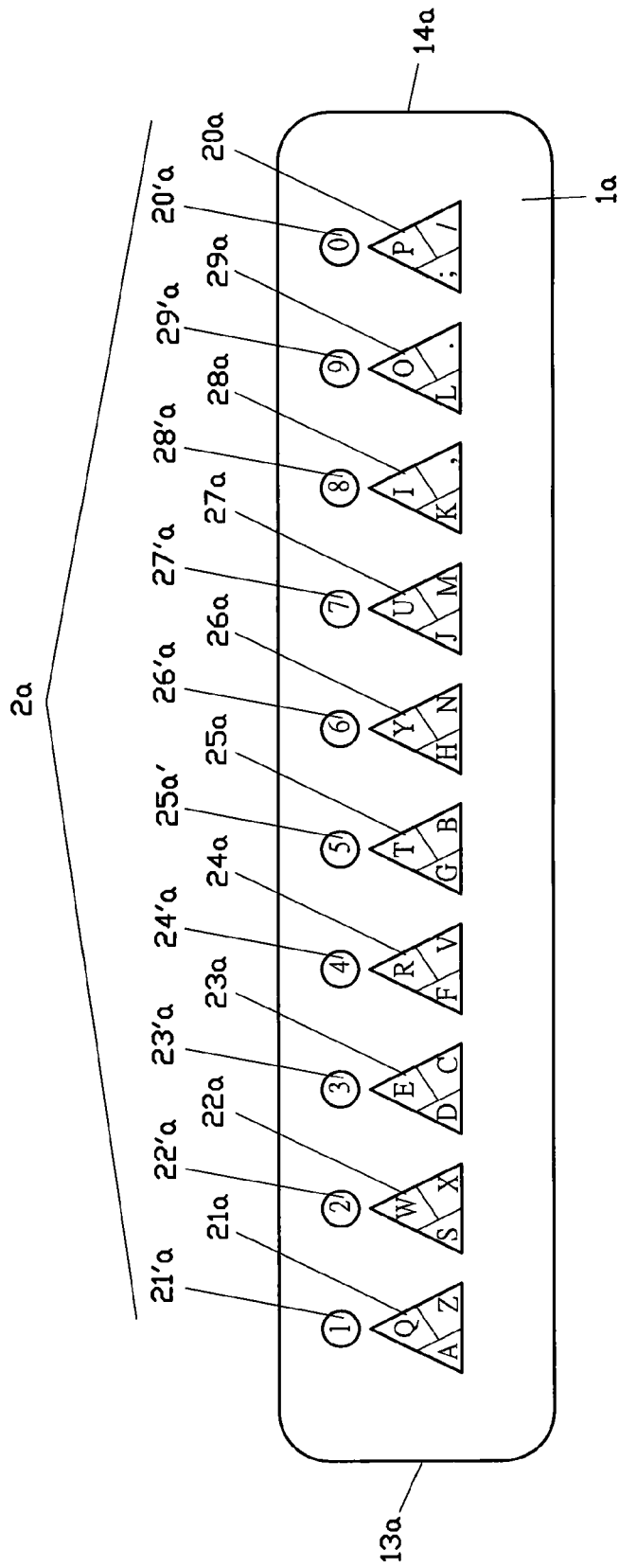
FIG. 4 is a schematic view of a layout of ten group keypads in accordance with a second preferred embodiment of the present invention.
Figure 5:
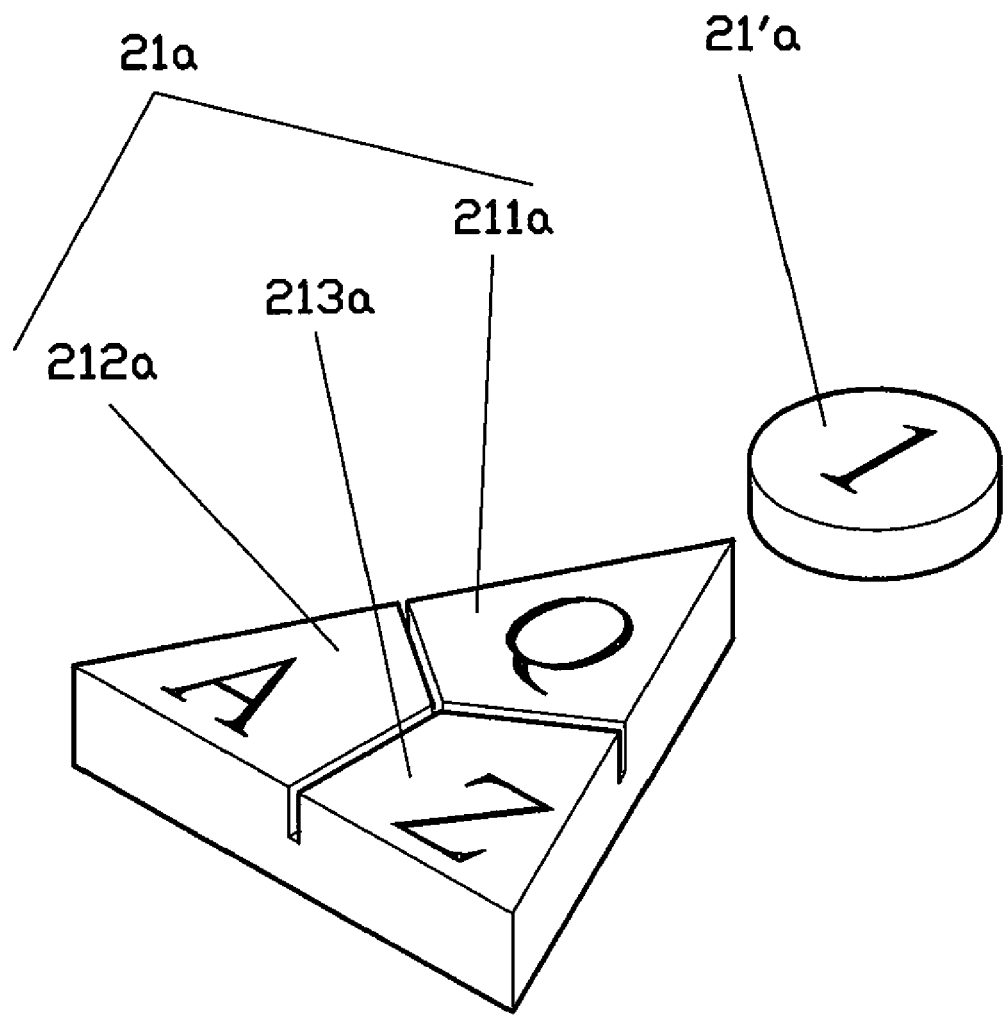
FIG. 5 is a schematic view of a first group keypad in accordance with the second preferred embodiment of the present invention.

With reference to FIGS. 4 and 5 for a group keypad structure in compliance with a standard keyboard installation in accordance with a second preferred embodiment of the present invention, the group keypad structure comprises ten group keypads 2a installed on a base 1a, and the base 1a includes a left side 13a and a right side 14a opposite to the left side 13a, and the ten group keypads 2a are sequentially arranged from the left side 13a to the right side 14a of the base 1a, and the ten group keypads 2a are a first group keypad 21a, a second group keypad 22a, a third group keypad 23a, a fourth group keypad 24a, a fifth group keypad 25a, a sixth group keypad 26a, a seventh group keypad 27a, an eighth group keypad 28a, a ninth group keypad 29a and a tenth group keypad 20a sequentially arranged from the left side 13a to the right side 14a of the base 1a and corresponding to the numeric keys labeled with numeric characters of the ten group keypads 2a respectively, and a first numeric key 21a', a second numeric key 22a', a third numeric key 23a', a fourth numeric key 24a', a fifth numeric key 25a', a sixth numeric key 26a', a seventh numeric key 27a', an eighth numeric key 28a', a ninth numeric key 29a', and a tenth numeric key 20a' are sequentially arranged from the left side 13a to the right side 14a of the base 1a.

In the second preferred embodiment of the present invention as shown in FIG. 5, each group keypad 2a is in a triangular shape. The first group keypad 21a and the first numeric key 21a' are used for illustrating the invention, and intersected mid-lines of the first group keypad 21a divide the first group keypad 21a into a first region 211a, a second region 212a and a third region 213a, and each region of the first group keypad 21a includes a corner of the triangular group keypad 2a, and each character is labeled at a corner of each region, wherein characters "Q, A, Z" are sequentially arranged in the first region 211a, the second region 212a and the third region 213a of the first group keypad 21a respectively, and the first numeric key 21a' is in a circular shape and includes a character "1", and the character setting and the input method for the remaining numeric keys are the same as the first preferred embodiment, and thus will not be described herein again.

Figure 6:
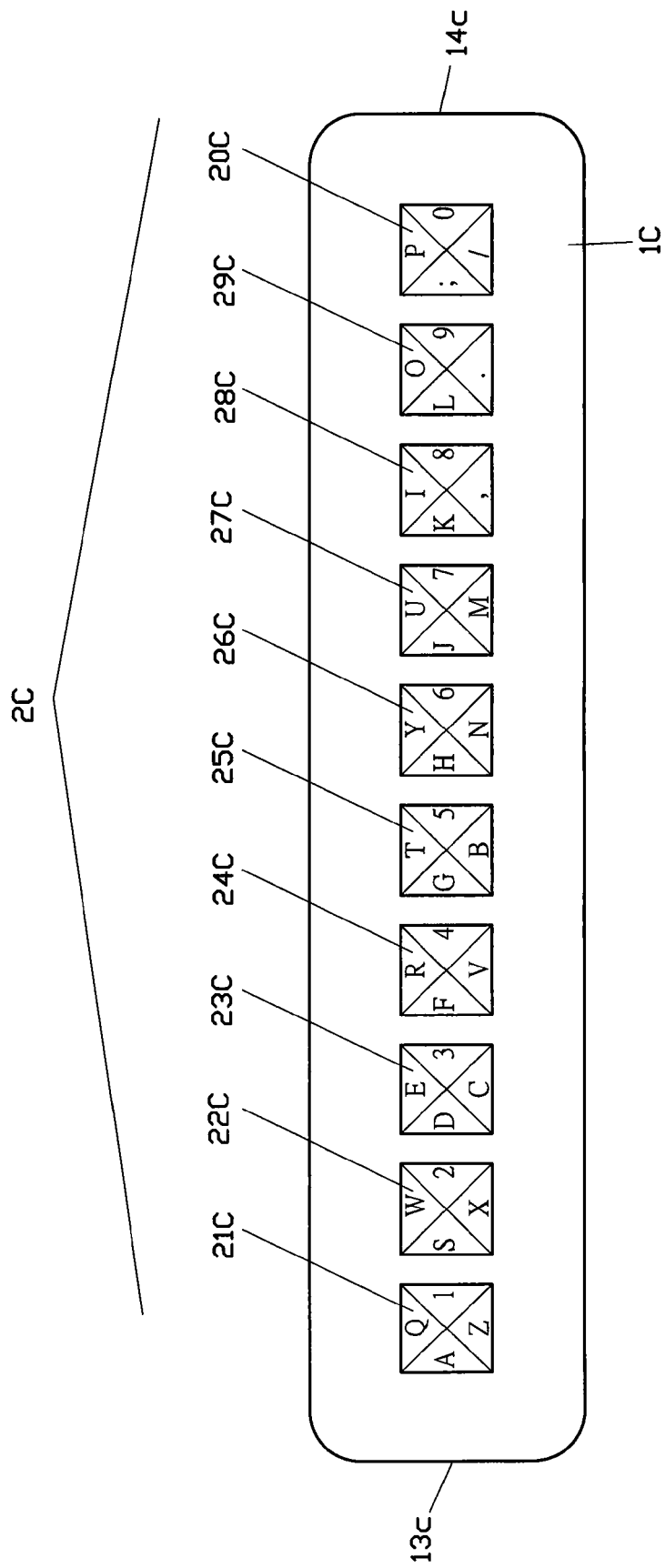
FIG. 6 is a schematic view of a layout of ten group keypads in accordance with a third preferred embodiment of the present invention.
Figure 7:
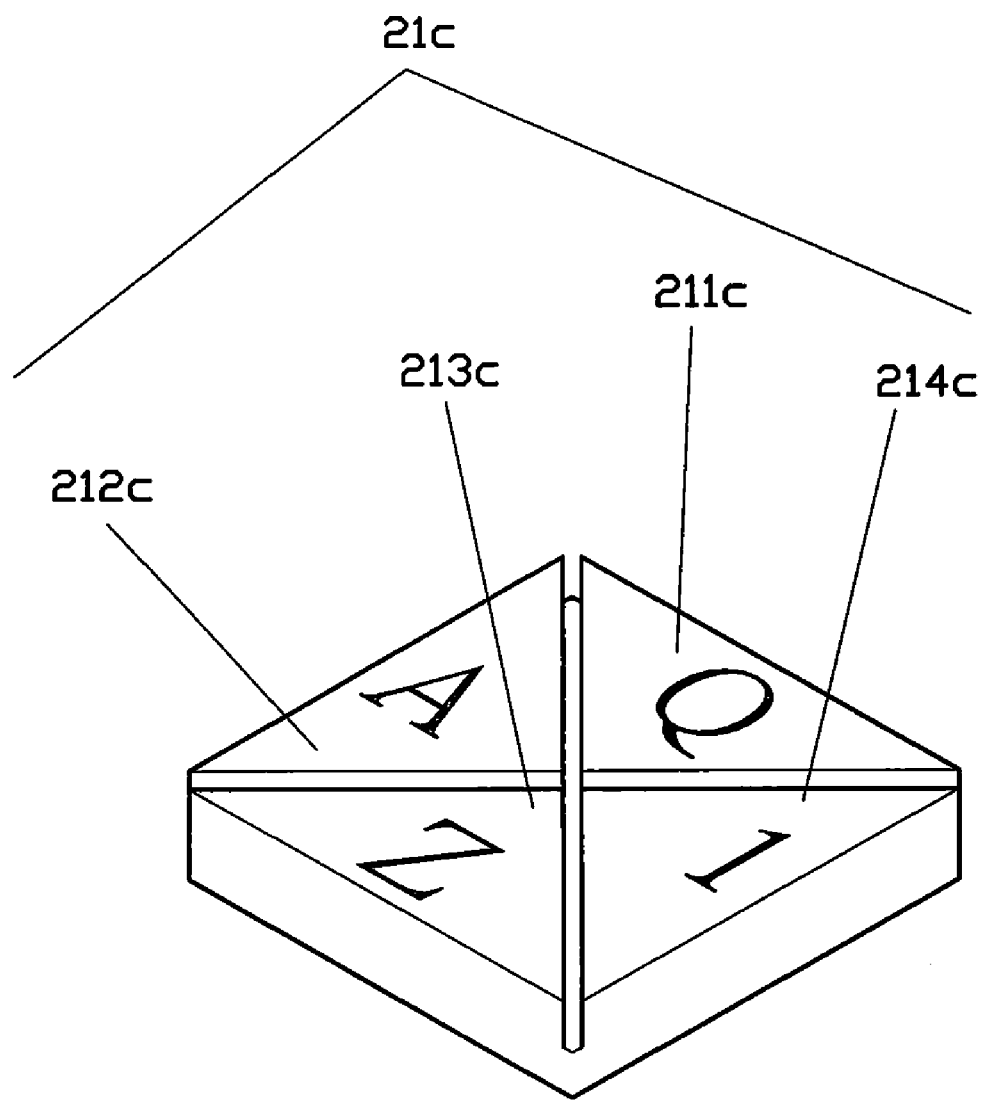
FIG. 7 is a schematic view of a first group keypad in accordance with a third preferred embodiment of the present invention.

With reference to FIGS. 6 and 7 for a group keypad structure in compliance with a standard keyboard installation in accordance with a third preferred embodiment of the present invention, the group keypad structure comprises ten group keypads 2c installed on a base 1c, and the base 1c includes a left side 13c and a right side 14c opposite to the left side 13c, and the ten group keypads 2c are sequentially arranged from the left side 13c to the right side 14c of the base 1c, wherein the first group keypad 21c to the tenth group keypad 20c are sequentially arranged from the left side 13c to the right side 14c of the base 1c.

The key structure and character arrangement of the third preferred embodiment of the present invention are shown in FIG. 7, wherein the ten group keypads 2c are in a square shape, and the first group keypad 21c is used for illustrating the invention, and two diagonals of the square shaped first group keypad 21c are intersected to divide the first group keypad 21c into a first region 211c, a second region 212c, a third region 213c and a fourth region 214c, and the first region 211c, the second region 212c and the third region 213c include characters "Q, A, Z", and the fourth region 214c includes a character "1", and each aforementioned character is labeled at a side of each region, wherein the characters of the ten group keypads 2c are sequentially arranged as follows:

The first group keypad 21c includes characters "Q, A, Z, 1";
the second group keypad 22c includes characters "W, S, X, 2";
the third group keypad 23c includes characters "E, D, C, 3";
the fourth group keypad 24c includes characters "R, F, V, 4";
the fifth group keypad 25c includes characters "T, G, B, 5";
the sixth group keypad 26c includes characters "Y, H, N, 6";
the seventh group keypad 27c includes characters "U, J, M, 7";
the eighth group keypad 28c includes characters "I, K, ,, 8";
the ninth group keypad 29c includes characters "O, L, ., 9"; and
the tenth group keypad 20c includes characters "P, ;, /, 0".

The input method is the same as the first preferred embodiment, and thus will not be described herein again.

Figure 8:
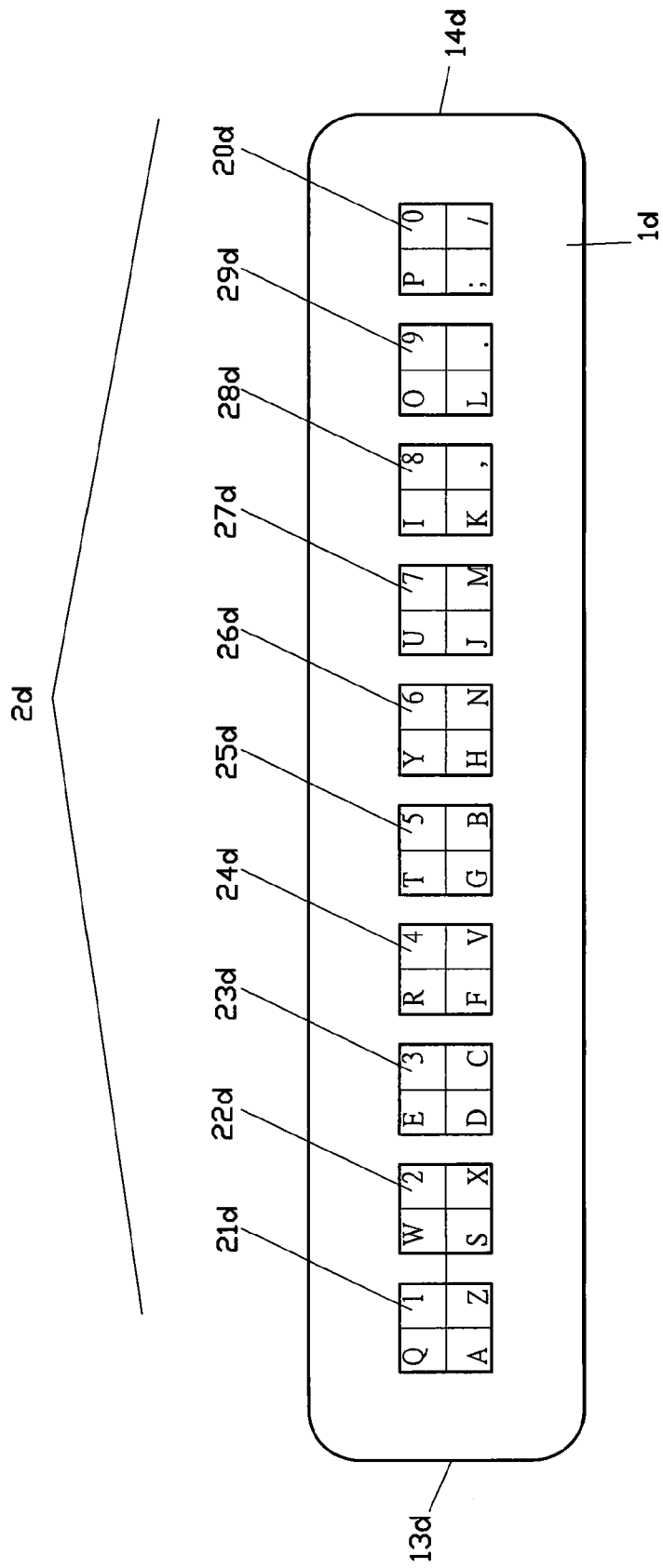
FIG. 8 is a schematic view of a layout of ten group keypads in accordance with a fourth preferred embodiment of the present invention.
Figure 9:
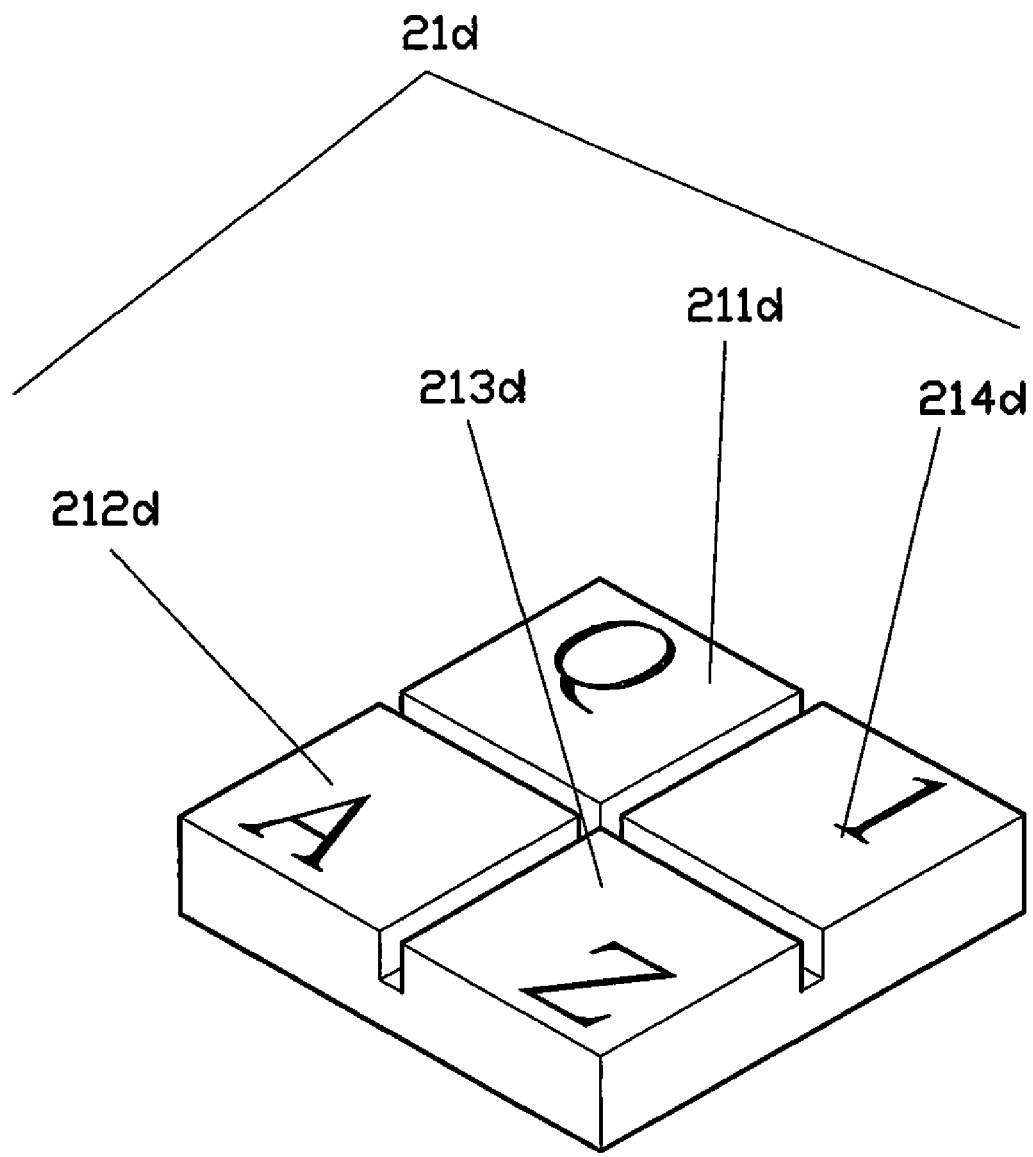
FIG. 9 is a schematic view of a first group keypad in accordance with the fourth preferred embodiment of the present invention.

With reference to FIGS. 8 and 9 for a group keypad structure in compliance with a standard keyboard installation in accordance with a fourth preferred embodiment of the present invention, the group keypad structure comprises ten group keypads 2d installed on a base 1d, and the base 1d includes a left side 13d and a right side 14d opposite to the left side 13d, and the ten group keypads 2d are sequentially arranged from the left side 13d to the right side 14d of the base 1d, and the first group keypad 21d to the tenth group keypad 20d are sequentially arranged from the left side 13d to the right side 14d of the base 1d.

The key structure and character arrangement of the fourth preferred embodiment of the present invention are shown in FIG. 9, wherein the ten group keypads 2d are in a square shape, and the first group keypad 21d is used for illustrating the present invention, and mid-lines of opposite sides of the first group keypad 21d are intersected to divide the first group keypad 21d into a first region 211d, a second region 212d, a third region 213d, and a fourth region 214d, and the first region 211*d*, the second region 212*d* and the third region 213*d* include characters "Q, A, Z" respectively, and the fourth region 214*d* includes a character "1", and each of the aforementioned characters is arranged at a corner of each region, such that the first group keypad 21*d* includes characters "Q, A, Z, 1", and the character setting and the input method of the remaining group keypads are the same as the first preferred embodiment, and thus will not be described herein again.

Figure 10:
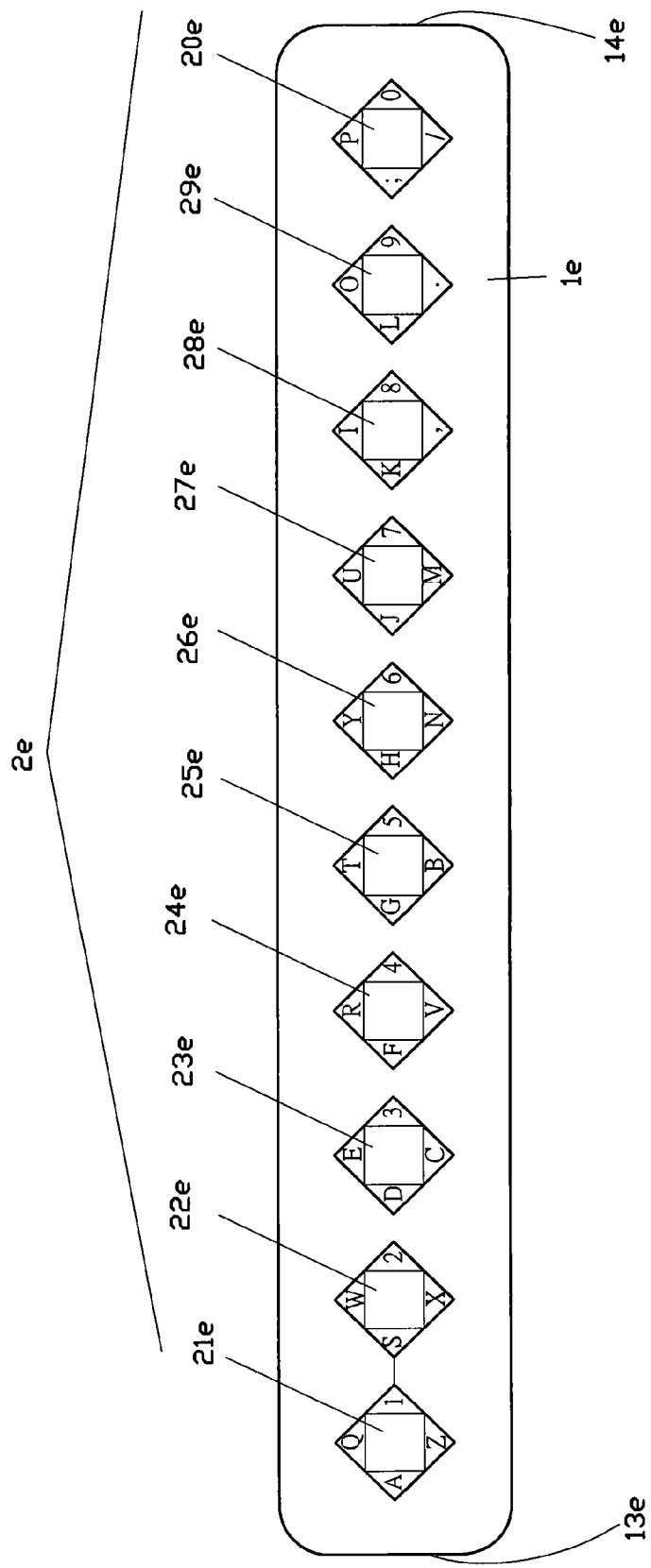
FIG. 10 is a schematic view of a layout of ten group keypads in accordance with a fifth preferred embodiment of the present invention.
Figure 11:
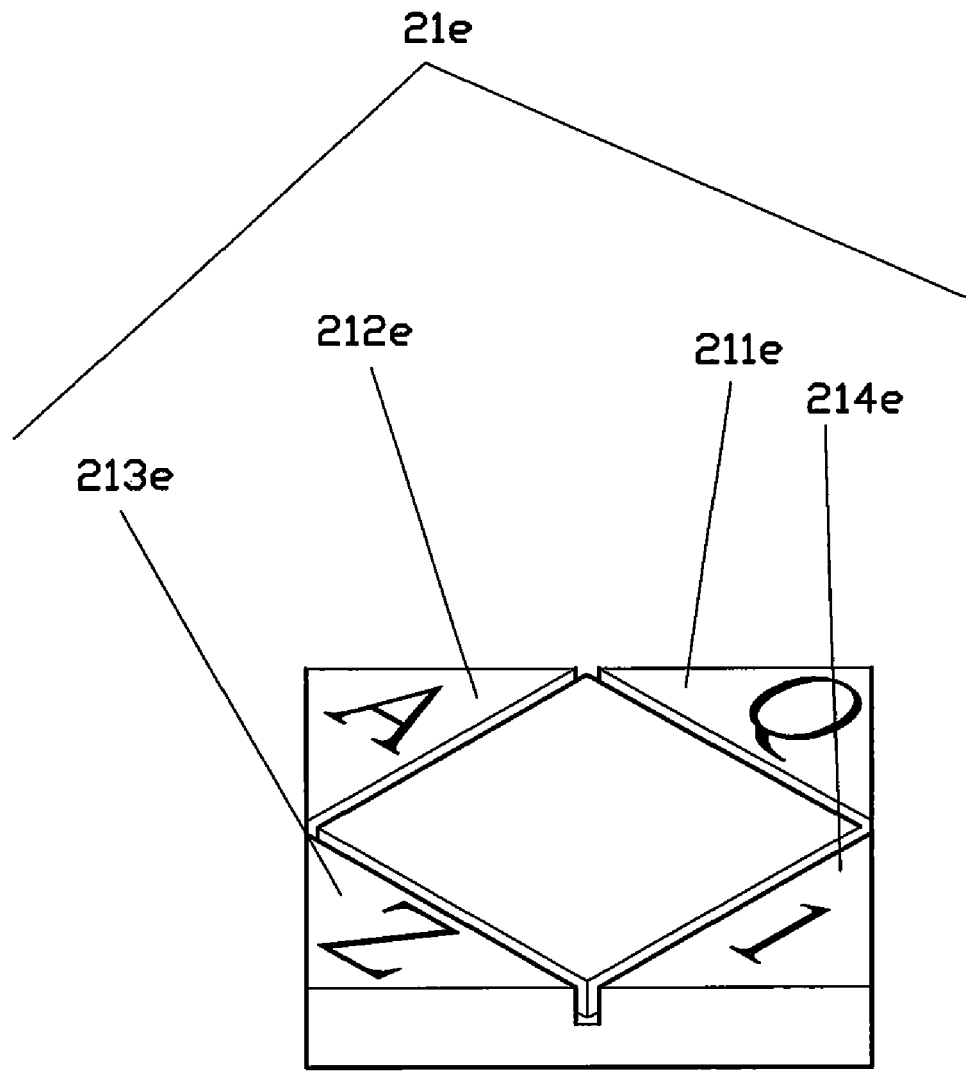
FIG. 11 is a schematic view of a first group keypad in accordance with the fifth preferred embodiment of the present invention.

With reference to FIGS. 10 and 11 for a group keypad structure in compliance with a standard keyboard installation in accordance with a fifth preferred embodiment of the present invention, the group keypad structure comprises ten group keypads 2*e* installed on a base 1*e*, and the base 1*e* includes a left side 13*e* and a right side 14*e* opposite to the left side 13*e*, and the ten group keypads 2*e* are sequentially arranged from the left side 13*e* to the right side 14*e* of the base 1*e*, and the first group keypad 21*e* to the tenth group keypad 20*e* are sequentially arranged from the left side 13*e* to the right side 14*e* of the base 1*e*.

The key structure and the character arrangement of the fifth preferred embodiment of the present invention are shown in FIG. 11, wherein the ten group keypads 2*e* are in a square shape, and the first group keypad 21*e* is used for illustrating the present invention. Lines formed by connecting mid-points of adjacent sides of the first group keypad 21*e* are used to divide the first group keypad 21*e* into a first region 211*e*, a second region 212*e*, a third region 213*e* and a fourth region 214*e*, wherein characters "Q, A, Z, 1" are sequentially arranged in the first region 211*e*, the second region 212*e*, the third region 213*e* and the fourth region 214*e* of the first group keypad 21*e*, and the character setting of the remaining group keypads is the same as the fourth preferred embodiment, and thus will not be described here again, and each character is labeled at a corner of each region. The input method is the same as the first preferred embodiment, and thus will not be described herein again.

In FIG. 12, the group keypads of the fourth preferred embodiment are applied to a computer keyboard together with other standard keyboard characters 3*d*, and four characters are installed on a same key to save the space of the conventional keys that require a gap between each other, and each character is labeled at the corner of each region to maintain a sufficient gap between the keys to prevent users from pressing a wrong key, and reduce the area and the weight of the keyboard significantly, so as to facilitate an easy carry. The invention can also be applied to a mobile phone without affecting the input speed.

Figure 13:
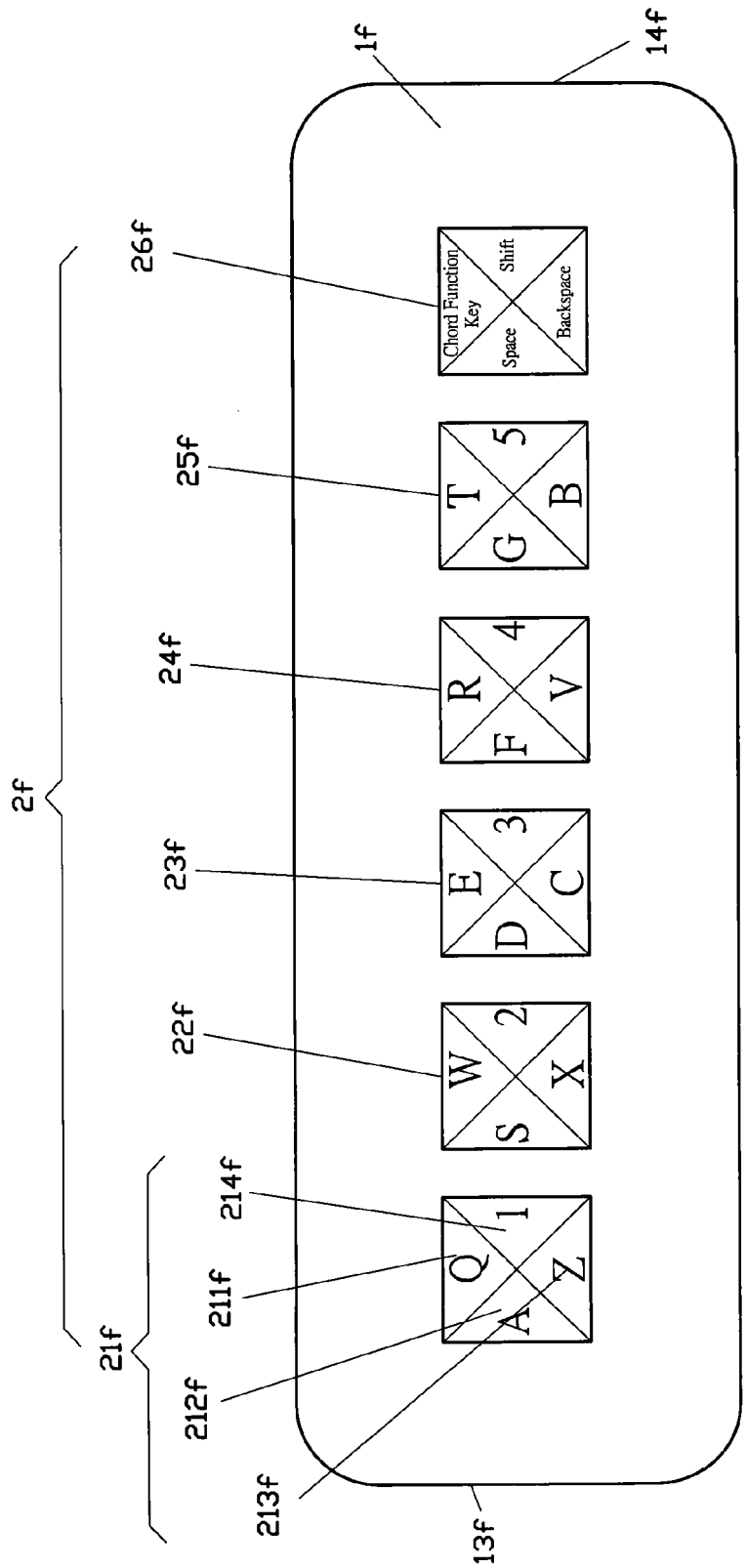
FIG. 13 is a schematic view of a layout of six group keypads in accordance with a sixth preferred embodiment of the present invention.

With reference to FIG. 13 for a group keypad structure in compliance with a standard keyboard installation in accordance with a sixth preferred embodiment of the present invention, the group keypad structure comprises six group keypads 2*f* installed on a base 1*f*, and the base 1*f* includes a left side 13*f* and a right side 14*f* opposite to the left side 13*f*, wherein each group keypad is in a rectangular shape, and the six group keypads 2*f* are a first group keypad 21*f*, a second group keypad 22*f*, a third group keypad 23*f*, a fourth group keypad 24*f*, a fifth group keypad 25*f* and a sixth group keypad 26*f* sequentially arranged from the left side 13*f* to the right side 14*f* of the base 1*f*. The first group keypad 21*f* is used for illustrating the present invention, and two diagonals of the rectangular group keypad are intersected to divide the first group keypad 21*f* into a first region 211*f*, a second region 212*f*, a third region 213*f* and a fourth region 214*f*, and each character is labeled at a side of each region. The characters are sequentially arranged in the first region 211*f*, the second region 212*f*, the third region 213*f* and the fourth region 214*f* of the base 1*f* of each group keypad as follows:

the first group keypad 21*f* includes characters "Q, A, Z, 1" or "P, ;, /, 0";

the second group keypad 22*f* includes characters "W, S, X, 2", or "O, L, ., 9";

the third group keypad 23*f* includes characters "E, D, C, 3", or "I, K, ,, 8";

the fourth group keypad 24*f* includes characters "R, F, V, 4", or "U, J, M, 7";

the fifth group keypad 25*f* includes characters "T, G, B, 5", or "Y, H, N, 6"; and the sixth group keypad 26*f* includes characters "Chord Function Key, Space, Backspace, Shift", and the chord function key is provided for switching the first group keypad 21*f* to any two groups of characters of the fifth group keypad 25*f*.

During an input process, the sixth group keypad 26*f* is used together with the first group keypad 21*f* to the fifth group keypad 25*f*, such that if the chord function key and the character "Q" of first group keypad 21*f* of the sixth group keypad 26*f* are pressed simultaneously, the input will be switched to a corresponding position of the character "P" of the first group keypad 21*f*. If the "Shift" key and the character "Q" are pressed simultaneously, the input will be switched to the lower case character "q". If the "Chord Function Key", "Shift" and "Q" are pressed simultaneously, the input will be switched to a position of the lower case character "p" of the first group keypad 21*f*. Therefore, it only requires six group keypads 2*f* to achieve the standard keyboard input method.

Figure 14:
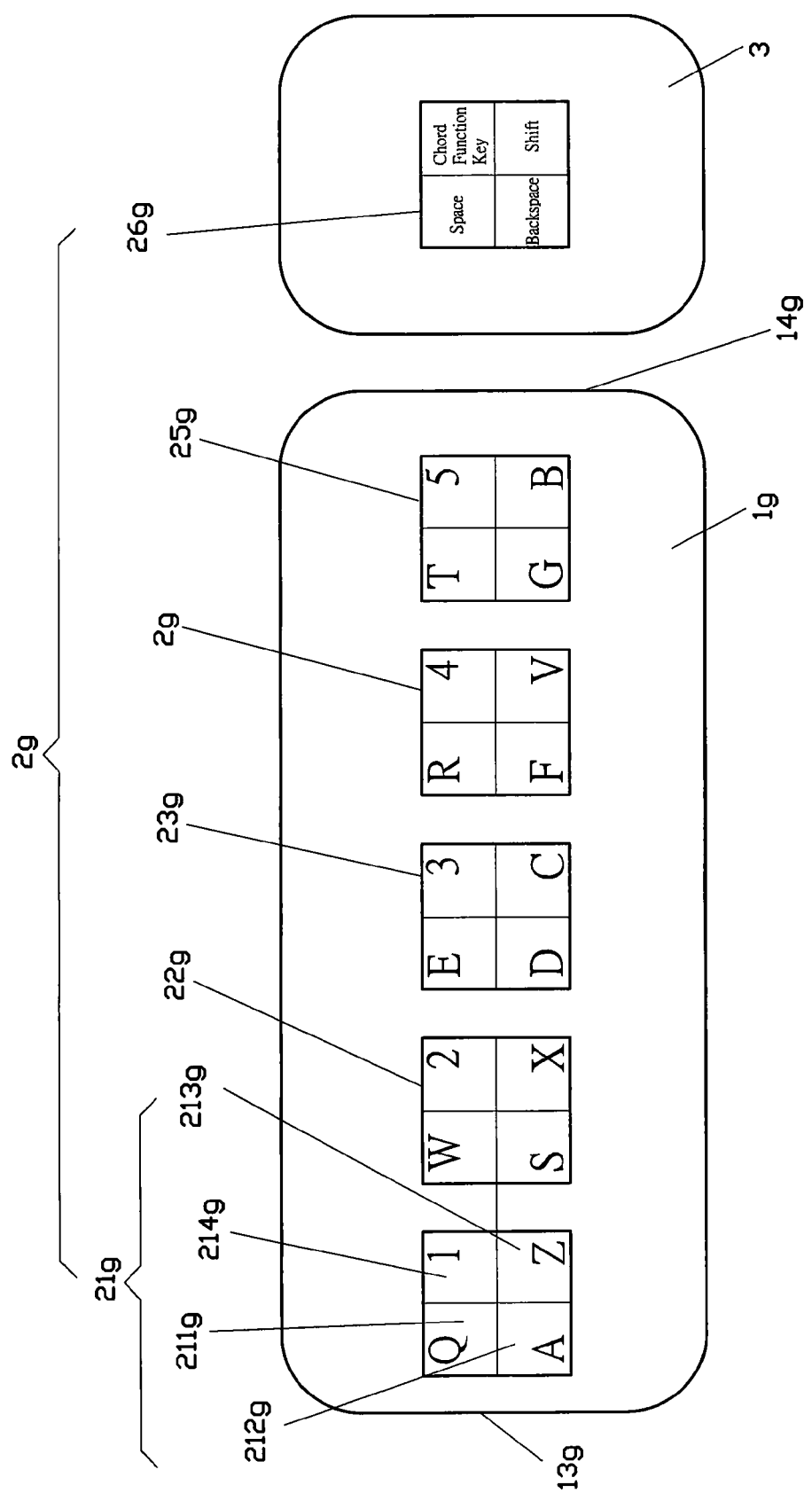
FIG. 14 is a schematic view of a layout of six group keypads in accordance with a seventh preferred embodiment of the present invention.
Figure 15:
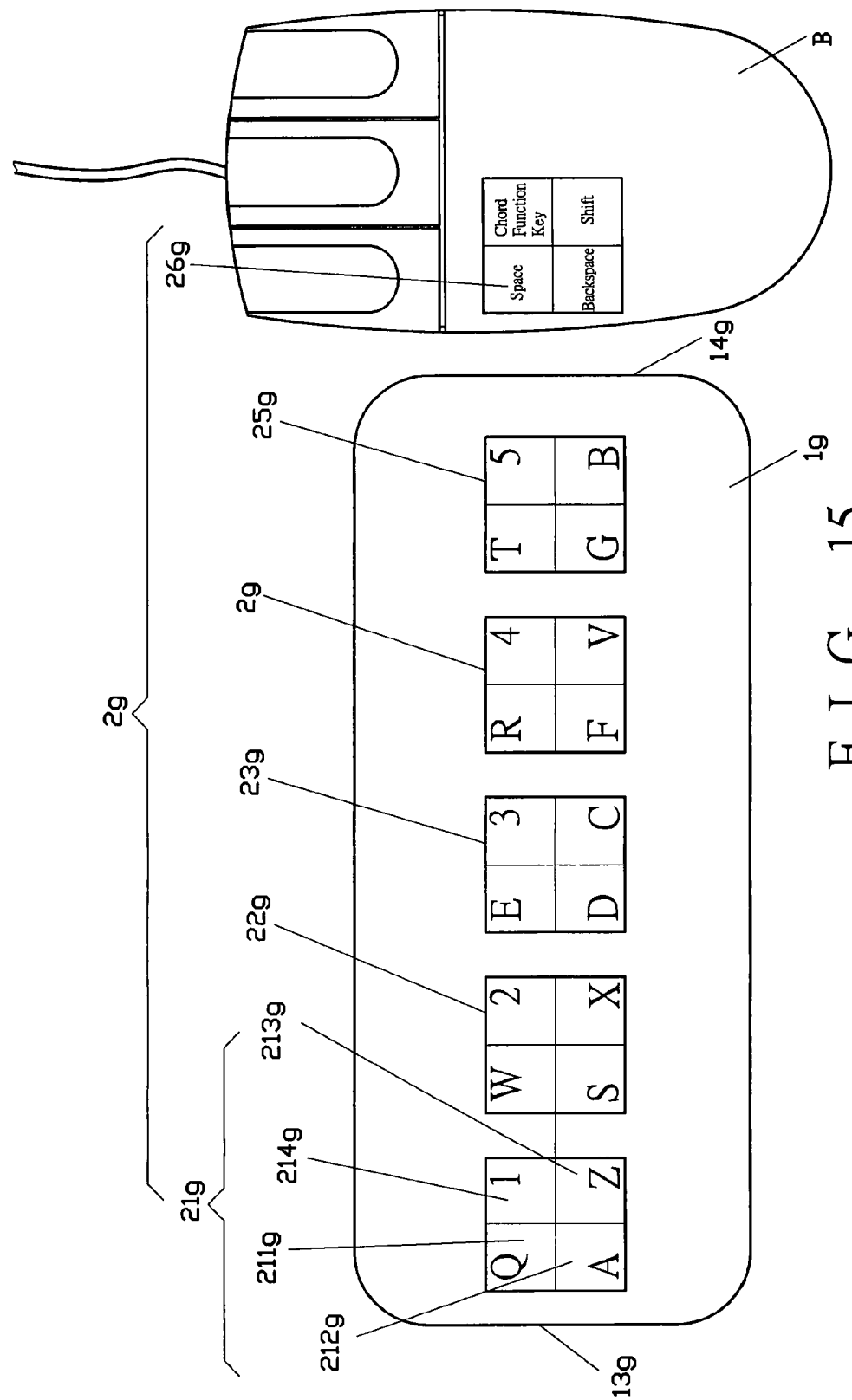
FIG. 15 is a schematic view of a seventh preferred embodiment applied together with a mouse in accordance with the seventh preferred embodiment of the present invention.
Figure 16:
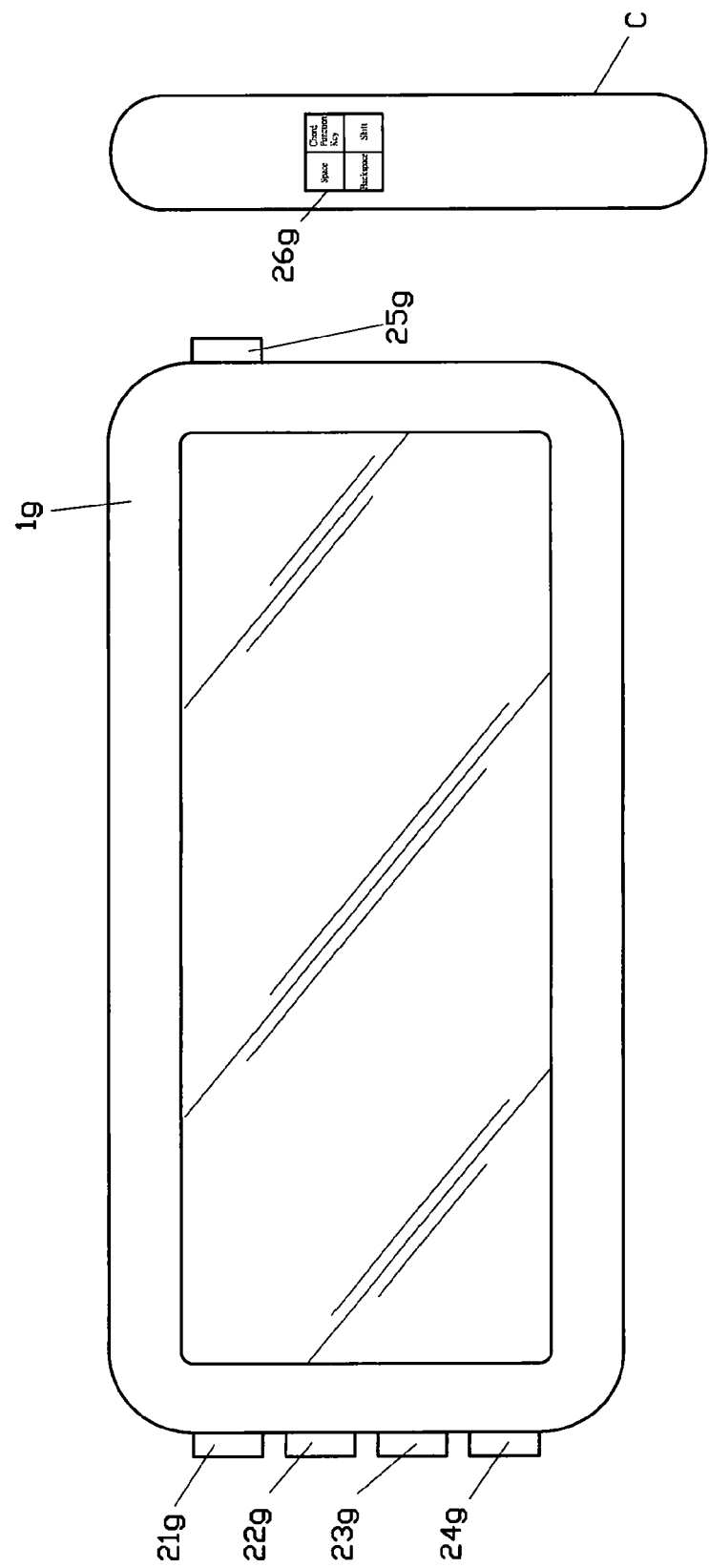
FIG. 16 is a schematic view of six group keypads coupled to a lateral side of a base and applied together with a touch pen in accordance with the present invention.

With reference to FIG. 14 for a group keypad structure in compliance with a standard keyboard installation in accordance with a seventh preferred embodiment of the present invention, the group keypad structure comprises six group keypads 2*g*, wherein each group keypad is in a rectangular shape, and the six group keypads are a first group keypad 21*g*, a second group keypad 22*g*, a third group keypad 23*g*, a fourth group keypad 24*g*, a fifth group keypad 25*g* and a sixth group keypad 26*g*, and the first group keypad 21*g*, the second group keypad 22*g*, the third group keypad 23*g*, the fourth group keypad 24*g* and the fifth group keypad 25*g* are sequentially installed on a base 1*g*, and the base 1*g* includes a left side 13*g* and a right side 14*g* opposite to the left side 13*g*, and the five group keypads 2*g* are sequentially arranged from the left side 13*g* to the right side 14*g* of the base 1*g*, and the sixth group keypad 26*g* is installed on a pointing input device 3 operated together with the base 1*g*. The first group keypad 21*g* is used for illustrating the present invention, and mid-lines of opposite sides of the first group keypad are intersected to divide the first group keypad 21*g* into a first region 211*g*, a second region 212*g*, a third region 213*g* and a fourth region 214*g*, and each character of each group keypad in the base 1*g* is labeled at a corner of each region, and characters of each group keypad sequentially arranged in the first region 211*g*, the second region 212*g*, the third region 213*g* and the fourth region 214*g* are the same as the sixth preferred embodiment, and the pointing input device 3 is a mouse B (as shown in FIG. 15), a laser pen or a touch pen, and the input method is the same as the sixth preferred embodiment, and thus will not be described herein again. With reference to FIG. 16, each group keypad 2*g* of the seventh preferred embodiment can be connected to a side of the base 1*g*. For example, the first group keypad 21*g*, the second group keypad 22*g*, the third group keypad 23*g*, and the fourth group keypad 24*g* are connected to an edge of the left side 13*g* of the base 1*g*, and the fifth group keypad 25*g* is connected to an edge of the right side 14*g* of the base 1*g*, and the sixth group keypad 26*g* is connected to the touch pen C to achieve the same effect of the seventh preferred embodiment. Each group keypad 2*g* is not limited to the aforementioned method, but it can also be a virtual key shown on a screen, and the touch pen C is provided for touching and triggering a character key.

Figure 17:
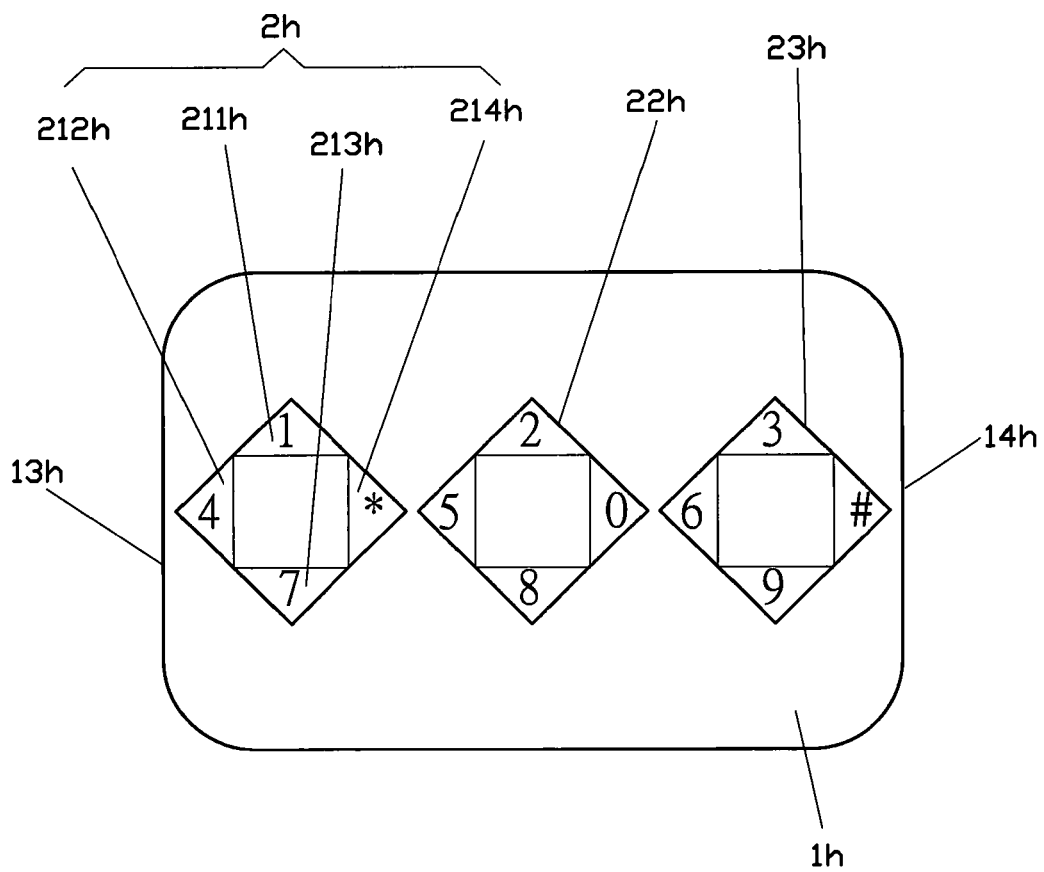
FIG. 17 is a schematic view of a layout of three group keypads in accordance with an eighth preferred embodiment of the present invention.

With reference to FIG. 17 for a group keypad structure in compliance with a standard keyboard installation in accordance with an eighth preferred embodiment of the present invention, the group keypad structure comprises three group keypads 2h, wherein each group keypad is in a rectangular shape, and the group keypads 2h are a first group keypad 21h, a second group keypad 22h and a third group keypad 23h installed on a base 1h, and the base 1h includes a left side 13h and a right side 14h opposite to the left side 13h, and the three group keypads 2h are sequentially arranged from the left side 13h to the right side 14h of the base 1h. The first group keypad 21h is used for illustrating the invention, and lines formed by connecting mid-points of adjacent sides of the first group keypad 21h are intersected to divide the first group keypad 21h into a first region 211h, a second region 212h, a third region 213h and a fourth region 214h, and characters of each region are "1, 4, 7, *", and each character of each group keypad in the base 1h is labeled at a corner of each region, and characters of each group keypad are sequentially arranged as follows:

The first group keypad 21h includes characters, "1, 4, 7, *";
the second group keypad 22h includes characters "2, 5, 8, 0"; and
the third group keypad 23h includes characters "3, 6, 9, #".

The using method is the same as the first preferred embodiment, and thus will not be described herein again.

Figure 18:
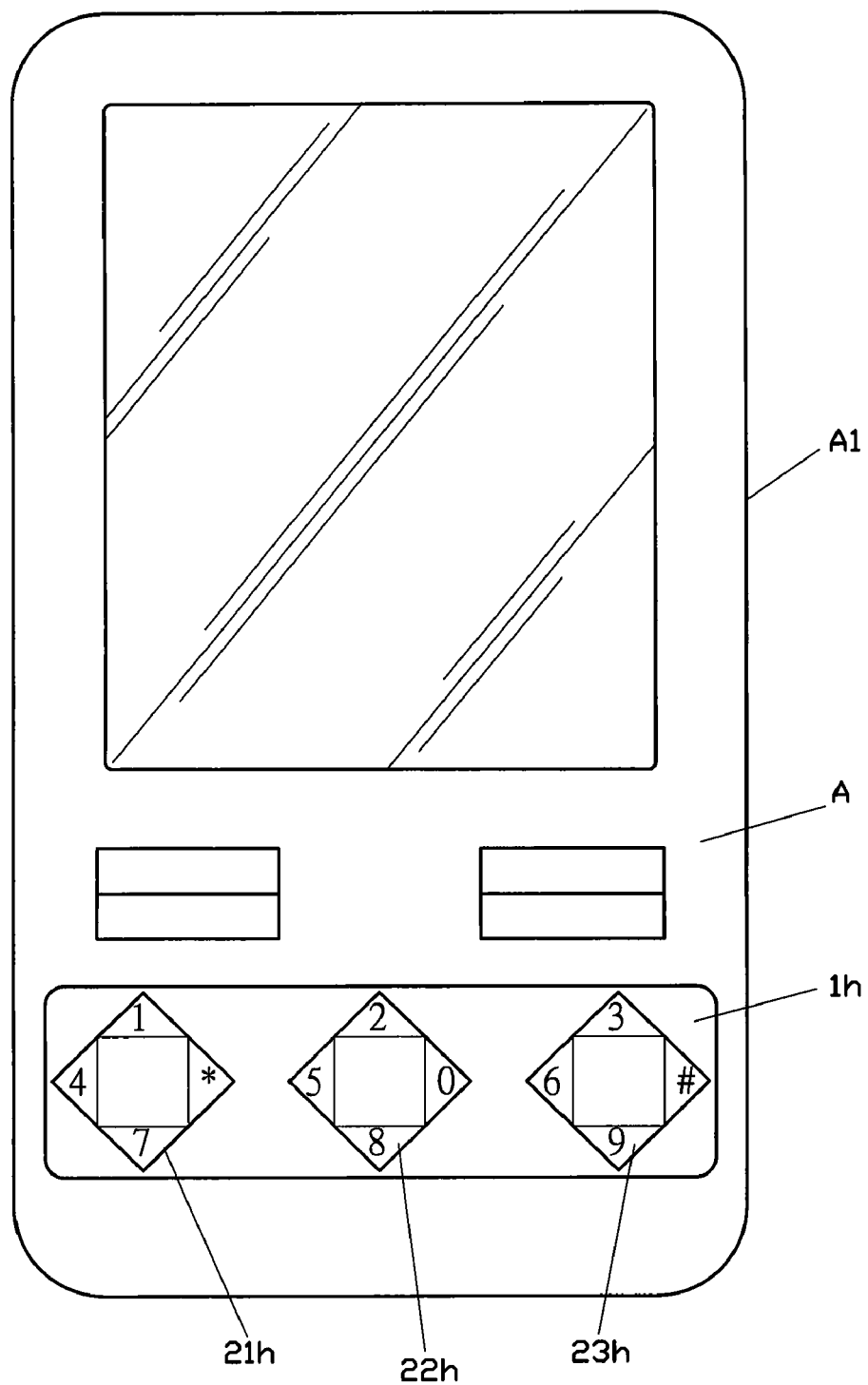
FIG. 18 is a schematic view of the eighth preferred embodiment applied to a mobile phone in accordance with the present invention.
Figure 19:
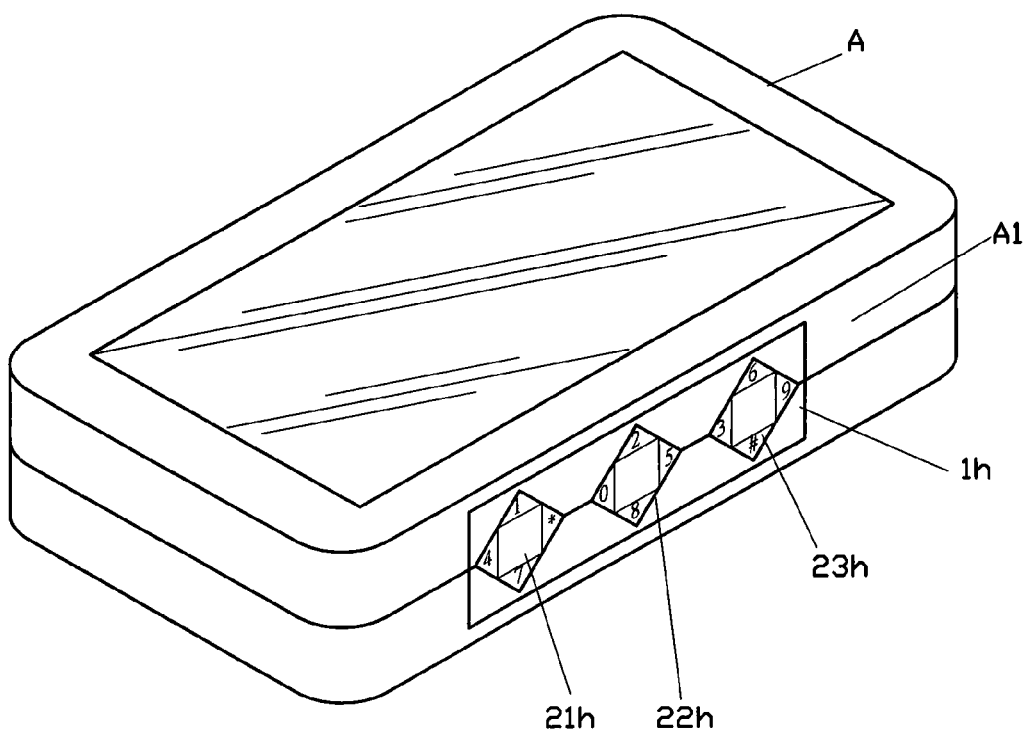
FIG. 19 is a schematic view of the eighth preferred embodiment applied to a lateral side of a mobile phone in accordance with the present invention.

The base 1h and its three group keypads 2h of the eighth preferred embodiment of the present invention as shown in FIG. 18 can be applied to a keyboard of any other electronic product such as a PDA or a blackberry. In addition to the application to the screen of the mobile phone, the three group keypads 2h can be installed on a lateral side A1 of the mobile phone A as shown in FIG. 19 to reserve the space of the screen for better viewing, while achieving the standard keyboard input method.

Figure 20:
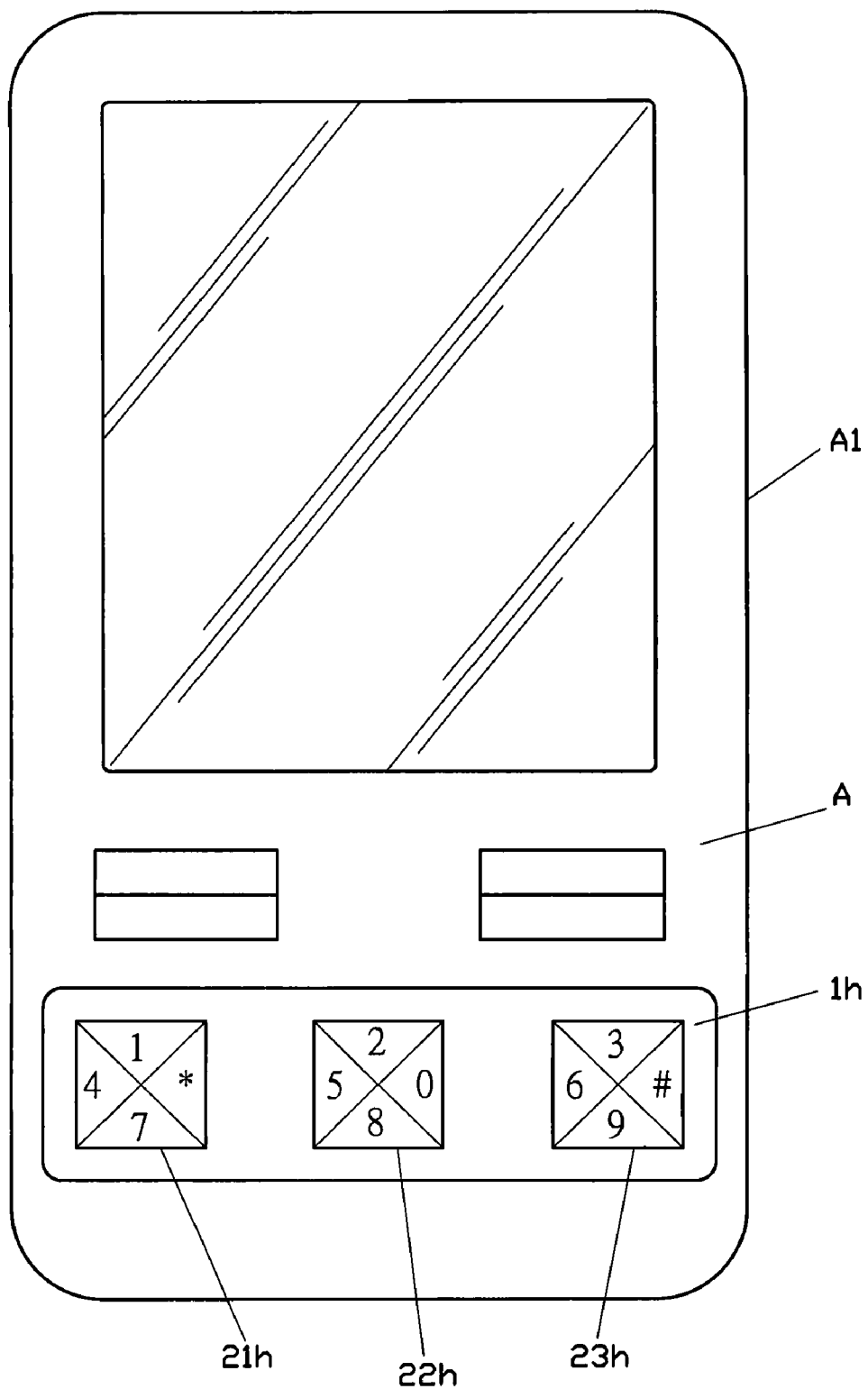
FIG. 20 is a schematic view of a ninth preferred embodiment applied to a mobile phone in accordance with the present invention.
Figure 21:
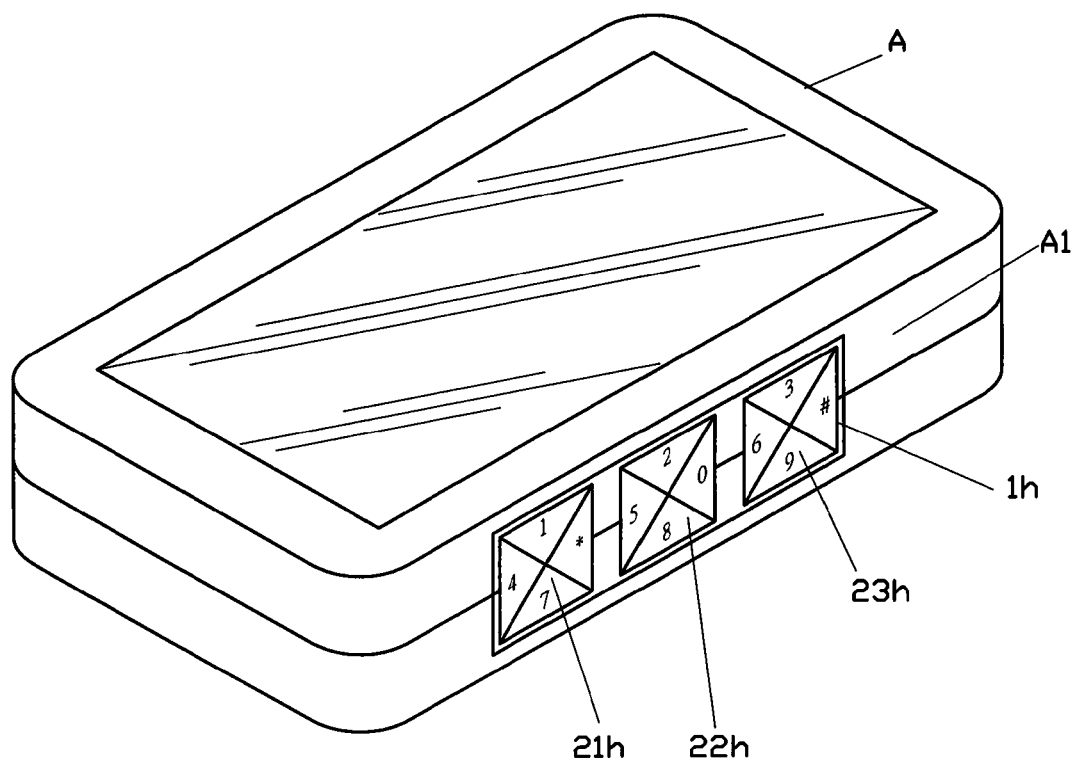
FIG. 21 is a schematic view of the ninth preferred embodiment applied to a lateral side of a mobile phone in accordance with the present invention.

With reference to FIGS. 20 and 21 for a group keypad structure in compliance with a standard keyboard installation in accordance with a ninth preferred embodiment of the present invention, this embodiment is a modified form of the eighth preferred embodiment, wherein the group keypads are in a rectangular shape, and the first group keypad 21h is used for illustrating the present invention, and two diagonals of each rectangular group keypad are intersected to divide the first group keypad 21h into a first region 211h, a second region 212h, a third region 213h and a fourth region 214h, and the first region 211h, the second region 212h, the third region 213h and the fourth region 214h sequentially include characters "1, 4, 7, *", and each of the aforementioned characters is labeled at a side of each region, and the character setting and the using method of each keypad are the same as the eighth preferred embodiment, and thus will not be described herein again.

The characters according to the aforementioned preferred embodiments of the present invention correspond to the characters of any keyboard input method, but not limited to the characters corresponding to the English input method only.

While the invention has been described by device of specific embodiments, numerous modifications and variations could be made thereto by those generally skilled in the art without departing from the scope and spirit of the invention set forth in the claims.

What is claimed is:

1. A group keypad structure in compliance with a standard keyboard installation, comprising ten group keypads installed on a base, the base including a left side and a right side opposite to the left side, the ten group keypads being arranged from the left side to the right side of the base, and including a first group keypad, a second group keypad, a third group keypad, a fourth group keypad, a fifth group keypad, a sixth group keypad, a seventh group keypad, an eighth group keypad, a ninth group keypad and a tenth group keypad sequentially arranged from the left side to the right side of the base, each group keypad being at least divided into a first region, a second region and a third region, each group keypad including a plurality of characters sequentially arranged in a first region, a second region and a third region as follows:

the first group keypad includes characters "Q, A, Z";
the second group keypad includes characters character "W, S, X";
the third group keypad includes characters character "E, D, C";
the fourth group keypad includes characters character "R, F, V";
the fifth group keypad includes characters character "T, G, B";
the sixth group keypad includes characters character "Y, H, N";
the seventh group keypad includes characters character "U, J, M";
the eighth group keypad includes characters character "I, K, ,";
the ninth group keypad includes characters character "O, L, ."; and
the tenth group keypad includes characters character "P, ;, /".

2. The group keypad structure in compliance with a standard keyboard installation as recited in claim 1, wherein the base includes an upper side and a lower side opposite to the upper side, each group keypad is in a rectangular shape, each group keypad is divided into the first region, the second region and the third region sequentially arranged from the upper side to the lower side of the base.

3. The group keypad structure in compliance with a standard keyboard installation as recited in claim 2, wherein, each group keypad includes a numeric key labeled with a numeric character, a first numeric key, a second numeric key, a third numeric key, a fourth numeric key, a fifth numeric key, a sixth numeric key, a seventh numeric key, an eighth numeric key, a ninth numeric key and a tenth numeric key are sequentially arranged from the left side to the right side of the base as follows:

the first numeric key includes a character "1";
the second numeric key includes a character "2";
the third numeric key includes a character "3";
the fourth numeric key includes a character "4";
the fifth numeric key includes a character "5";
the sixth numeric key includes a character "6";
the seventh numeric key includes a character "7";
the eighth numeric key includes a character "8";
the ninth numeric key includes a character "9"; and
the tenth numeric key includes a character "0".

4. The group keypad structure in compliance with a standard keyboard installation as recited in claim 1, wherein each group keypad is in a triangular shape, a first region, a second region and a third region are divided from a central area of each group keypad, each region of each group keypad includes a corner of the triangular shape, each character is labeled at a corner of each region.

5. The group keypad structure in compliance with a standard keyboard installation as recited in claim 4, wherein each group keypad includes a numeric key labeled with a numeric character, a first numeric key, a second numeric key, a third numeric key, a fourth numeric key, a fifth numeric key, a sixth numeric key, a seventh numeric key, an eighth numeric key, a ninth numeric key and a tenth numeric key are sequentially arranged from the left side to the right side of the base as follows:

the first numeric key includes a character "1";
the second numeric key includes a character "2";
the third numeric key includes a character "3";
the fourth numeric key includes a character "4";
the fifth numeric key includes a character "5";
the sixth numeric key includes a character "6";
the seventh numeric key includes a character "7";
the eighth numeric key includes a character "8";
the ninth numeric key includes a character "9"; and
the tenth numeric key includes a character "0".

6. The group keypad structure in compliance with a standard keyboard installation as recited in claim 1, wherein each group keypad is in a square shape.

7. The group keypad structure in compliance with a standard keyboard installation as recited in claim 6, wherein each group keypad is divided into a first region, a second region, a third region and a fourth region by two intersected diagonals of each group keypad, each character is labeled at a side of each region.

8. The group keypad structure in compliance with a standard keyboard installation as recited in claim 7, wherein the fourth region of each group keypad includes the characters sequentially arranged as follows:

the first group keypad includes a character "1";
the second group keypad includes a character "2";
the third group keypad includes a character "3";
the fourth group keypad includes a character "4";
the fifth group keypad includes a character "5";
the sixth group keypad includes a character "6";
the seventh group keypad includes a character "7";
the eighth group keypad includes a character "8";
the ninth group keypad includes a character "9"; and
the tenth group keypad includes a character "0".

9. The group keypad structure in compliance with a standard keyboard installation as recited in claim 6, wherein each group keypad is divided into a first region, a second region, a third region and a fourth region of intersected mid-lines of opposite sides of the group keypad, each character of each group keypad is labeled at a corner of each region.

10. The group keypad structure in compliance with a standard keyboard installation as recited in claim 9, wherein the fourth region of each group keypad includes the characters sequentially arranged as follows:

the first group keypad includes a character "1";
the second group keypad includes a character "2";
the third group keypad includes a character "3";
the fourth group keypad includes a character "4";
the fifth group keypad includes a character "5";
the sixth group keypad includes a character "6";
the seventh group keypad includes a character "7";
the eighth group keypad includes a character "8";
the ninth group keypad includes a character "9"; and
the tenth group keypad includes a character "0".

11. The group keypad structure in compliance with a standard keyboard installation as recited in claim 6, wherein each group keypad is divided into a first region, a second region, a third region and a fourth region by lines formed by connecting mid-points of adjacent sides of each group keypad, each character of each group keypad is labeled at a corner of each region.

12. The group keypad structure in compliance with a standard keyboard installation as recited in claim 11, wherein each group keypad includes the characters sequentially arranged in the fourth region as follows:

the first group keypad includes a character "1";
the second group keypad includes a character "2";
the third group keypad includes a character "3";
the fourth group keypad includes a character "4";
the fifth group keypad includes a character "5";
the sixth group keypad includes a character "6";
the seventh group keypad includes a character "7";
the eighth group keypad includes a character "8";
the ninth group keypad includes a character "9"; and
the tenth group keypad includes a character "0".

13. The group keypad structure in compliance with a standard keyboard installation as recited in claim 1, wherein the characters correspond to a plurality of characters of a keyboard input method respectively.

14. A group keypad structure in compliance with a standard keyboard installation, comprising five group keypads installed on a base, the base including a left side and a right side opposite to the left side, each group keypad being in a rectangular shape, the five group keypads including a first group keypad, a second group keypad, a third group keypad, a fourth group keypad and a fifth group keypad being sequentially arranged from the left side to the right side of the base, each group keypad being divided into a first region, a second region, a third region and a fourth region, each group keypad including two groups of corresponding characters sequentially arranged in the first region, the second region, the third region and the fourth region as follows:

the first group keypad includes characters "Q, A, Z, 1" or "P, ;, /, 0";
the second group keypad includes characters "W, S, X, 2", or "O, L, ., 9";
the third group keypad includes characters "E, D, C, 3", or "I, K, ,, 8";
the fourth group keypad includes characters "R, F, V, 4", or "U, J, M, 7";
the fifth group keypad includes characters "T, G, B, 5", or "Y, H, N, 6"; and
a sixth group keypad is divided into a first region, a second region, a third region and a fourth region, characters "Chord Function Key, Space, Backspace, Shift" are sequentially arranged in the first region, the second region, the third region and the fourth region respectively, the chord function key is provided for switching the first group keypad to any one of the two groups of characters of the fifth group keypad character.

15. The group keypad structure in compliance with a standard keyboard installation as recited in claim 14, wherein the sixth group keypad is installed on the base.

16. The group keypad structure in compliance with a standard keyboard installation as recited in claim 14, wherein the sixth group keypad is installed on a pointing input device operated together with the base.

17. The group keypad structure in compliance with a standard keyboard installation as recited in claim 14, wherein each group keypad is divided into a first region, a second region, a third region and a fourth region by two intersected diagonals of each group keypad and each character is labeled at a side of each region.

18. The group keypad structure in compliance with a standard keyboard installation as recited in claim 14, wherein each group keypad is divided into a first region, a second region, a third region and a fourth region by mid-lines of opposite sides of each group keypad and each character of each group keypad is labeled at a corner of each region.

19. The group keypad structure in compliance with a standard keyboard installation as recited in claim 14, wherein each group keypad is divided into a first region, a second region, a third region and a fourth region by lines formed by connecting mid-points of adjacent sides of each group keypad, each character of each group keypad is labeled at a corner of each region.

20. The group keypad structure in compliance with a standard keyboard installation as recited in claim 14, wherein the characters correspond to a plurality of characters of a keyboard input method respectively.

21. A group keypad structure in compliance with a standard keyboard installation, comprising three group keypads installed on a base, the base including a left side and a right side opposite to the left side, each group keypad being in a rectangular shape and including a first group keypad, a second group keypad and a third group keypad sequentially arranged, each group keypad divided into a first region, a second region, a third region and a fourth region, the first region, the second region, the third region and the fourth region of each group keypad including the characters sequentially arranged as follows:

the first group keypad includes characters "1, 4, 7, *";
the second group keypad includes characters "2, 5, 8, 0"; and
the third group keypad includes characters "3, 6, 9, #".

22. The group keypad structure in compliance with a standard keyboard installation as recited in claim 21, wherein each group keypad is divided into a first region, a second region, a third region and a fourth region by two intersected diagonals, each character is labeled at a side of each region.

23. The group keypad structure in compliance with a standard keyboard installation as recited in claim 21, wherein each group keypad is divided into by first region, second region, third region and fourth region by intersected mid-lines of opposite sides of each group keypad, each character of each group keypad is labeled at a corner of each region.

24. The group keypad structure in compliance with a standard keyboard installation as recited in claim 21, wherein each group keypad is divided into a first region, a second region, a third region and a fourth region by lines formed by connecting mid-points of adjacent sides of the group keypad, each character of each group keypad is labeled at a corner of each region.

25. The group keypad structure in compliance with a standard keyboard installation as recited in claim 21, wherein the characters correspond to a plurality of characters of a keyboard input method respectively.

* * * * *